(12) United States Patent
Nangou et al.

(10) Patent No.: US 10,556,411 B2
(45) Date of Patent: Feb. 11, 2020

(54) WATER BARRIER LAMINATE

(71) Applicant: TOYO SEIKAN GROUP HOLDINGS, LTD., Tokyo (JP)

(72) Inventors: Shunya Nangou, Yokohama (JP); Shinpei Okuyama, Yokohama (JP); Kota Mori, Yokohama (JP); Naru Kawahara, Yokohama (JP); Misato Yagisawa, Yokohama (JP)

(73) Assignee: TOYO SEIKAN GROUP HOLDINGS, LTD., Tokyo (JP)

( * ) Notice: Subject to any disclaimer, the term of this patent is extended or adjusted under 35 U.S.C. 154(b) by 72 days.

(21) Appl. No.: 15/753,086

(22) PCT Filed: Aug. 9, 2016

(86) PCT No.: PCT/JP2016/073438
§ 371 (c)(1),
(2) Date: Feb. 15, 2018

(87) PCT Pub. No.: WO2017/030047
PCT Pub. Date: Feb. 23, 2017

(65) Prior Publication Data
US 2018/0236757 A1     Aug. 23, 2018

(30) Foreign Application Priority Data
Aug. 18, 2015   (JP) .................. 2015-161419

(51) Int. Cl.
| B32B 27/36 | (2006.01) |
| B32B 9/04 | (2006.01) |
| B32B 27/08 | (2006.01) |
| B32B 27/30 | (2006.01) |
| B32B 27/32 | (2006.01) |
| C23C 16/455 | (2006.01) |

(52) U.S. Cl.
CPC ............. *B32B 27/36* (2013.01); *B32B 9/045* (2013.01); *B32B 27/08* (2013.01); *B32B 27/306* (2013.01); *B32B 27/32* (2013.01); *C23C 16/455* (2013.01); *B32B 2307/7246* (2013.01)

(58) Field of Classification Search
USPC ....................................................... 428/480
See application file for complete search history.

(56) References Cited

U.S. PATENT DOCUMENTS

| 9,493,348 B2 | 11/2016 | Ramadas et al. |
| 9,676,171 B2 | 6/2017 | Okuyama et al. |
| 2012/0125437 A1 | 5/2012 | Okawara et al. |
| 2014/0295196 A1 | 10/2014 | Chiu et al. |
| 2016/0243801 A1 | 8/2016 | Okuyama et al. |
| 2017/0098799 A1 | 4/2017 | Ramadas et al. |

FOREIGN PATENT DOCUMENTS

| CN | 104070744 A | 10/2014 |
| JP | 08-197692 A | 8/1996 |
| JP | 2000-255579 A | 9/2000 |
| JP | 2006-007565 A | 1/2006 |
| JP | 2006-168298 A | 6/2006 |
| JP | 2009-090633 A | 4/2009 |
| JP | 2009-255040 A | 11/2009 |
| JP | 2010-511267 A | 4/2010 |
| JP | 2011-131395 A | 7/2011 |
| JP | 2012-076385 A | 4/2012 |
| JP | 2014-168949 A | 9/2014 |
| JP | 2014-168950 A | 9/2014 |
| JP | 2014-195911 A | 10/2014 |
| JP | 2015-096320 A | 5/2015 |
| WO | 2011/013341 A1 | 2/2011 |
| WO | 2014/123197 A1 | 8/2014 |

OTHER PUBLICATIONS

International Search Report of PCT/JP2016/073438 dated Sep. 27, 2016 [PCT/ISA/210].
Communication dated Jun. 20, 2019 from the State Intellectual Property Office of the P.R.C. in counterpart Application No. 201680060838.7.

*Primary Examiner* — Terressa Boykin
(74) *Attorney, Agent, or Firm* — Sughrue Mion, PLLC

(57) ABSTRACT

A water barrier laminate (11) including a plastic base material (1) that faces the atmosphere of a high water content, as well as a first inorganic barrier layer (3), a water-trapping layer (5) and a second inorganic barrier layer (7) formed in this order on the plastic base material (1) on the side that does not face the atmosphere of the high water content, wherein an auxiliary water-trapping layer (10) is formed on the second inorganic barrier layer (7) on the side opposite to the water-trapping layer (5) to trap the water from the side surface, the auxiliary water-trapping layer (10) being located on the surface that faces the atmosphere of a low water content or being located in a region at a distance of not more than 20 μm from the surface that faces the atmosphere of the low water content.

11 Claims, 19 Drawing Sheets

EXAMPLE 14

EXAMPLE 15

EXAMPLE 17

EXAMPLES 18, 21
COMP. EXAMPLE 4

EXAMPLES 19, 20

EXAMPLE 22

EXAMPLE 23

EXAMPLE 24

EXAMPLE 25

EXAMPLES 26, 29

EXAMPLE 31

EXAMPLE 32

EXAMPLE 33

EXAMPLE 34

WATER BARRIER LAMINATE

CROSS REFERENCE TO RELATED APPLICATIONS

This application is a National Stage of International Application No. PCT/JP2016/073438, filed Aug. 9, 2016, claiming priority based on Japanese Patent Application No. 2015-161419, filed Aug. 18, 2015.

TECHNICAL FIELD

This invention relates to a water barrier laminate having inorganic barrier layers and water-trapping layers.

BACKGROUND ART

As means for improving properties and, specifically, gas-barrier property of various plastic base materials, there has been known an art of forming an inorganic barrier layer of a silicon oxide or the like by vacuum evaporation on the surfaces of the plastic base materials (patent document 1).

In a variety of electronic devices that have been developed and put into practice in recent years, such as organic electroluminescent (organic EL) devices, solar cells, touch panels, e-papers and the like, that must avoid leakage of electric charges, it is a requirement to impart a high degree of water-barrier property to the plastic base materials forming the circuit boards or to the films sealing the circuit boards. However, the inorganic barrier layer formed as described above is not still capable of meeting a high degree of requirement for attaining the water-barrier property. Therefore, a variety of proposals have been made for improving the water-barrier property.

A patent document 2, for example, proposes a gas-barrier laminate comprising an inorganic barrier layer formed on the surface of a plastic base material, and a sealing layer formed on the inorganic barrier layer, the sealing layer being dispersed with nanoparticles of a metal oxide or carbon nanotubes as a moisture-absorbing agent.

A patent document 3 proposes a gas-barrier laminate (film) comprising an organic layer, an inorganic barrier layer and a water-trapping layer formed on a base film, the water-trapping layer being formed of a moisture-absorbing polymer (concretely, a polyamide) or being formed by dispersing a moisture-absorbing material such as silica gel or aluminum oxide in a polymer binder such as a resin that can be cured with electron rays or ultraviolet rays.

Further, a patent document 4 proposes a gas-barrier laminate comprising a gas-barrier film and a moisture-absorbing layer formed by vacuum evaporation on the surface of a plastic base material, the moisture-absorbing layer containing an alkylene oxide, acrylate nanoparticles or an organometal complex.

Moreover, patent documents 5 to 7, which are filed by the present applicant, are proposing gas-barrier laminates obtained by forming a water-trapping layer on an inorganic barrier layer on a plastic base material, the water-trapping layer being the one obtained by dispersing a specific granular moisture-absorbing agent in the matrix of an ionic polymer.

In order to improve the water-barrier property to a high degree as described above, there have been proposed laminates of various layer constitutions combining the inorganic barrier layer and the water-trapping layer (moisture-absorbing layer, water-trapping layer, etc.) together. The above water barrier laminates are capable of exhibiting a high degree of barrier property against the water that flows in the direction of thickness (in the direction of surface) of the laminate but are not still capable of exhibiting the barrier property to a sufficient degree against the water that flows in from the side surfaces (end surfaces) thereof. Besides, no study has so far been conducted concerning the water that flows in from the end surfaces.

PRIOR ART DOCUMENTS

Patent Documents

Patent document 1: JP-A-2000-255579
Patent document 2: JP-A-2010-511267
Patent document 3: JP-A-2009-90633
Patent document 4: JP-A-2011-131395
Patent document 5: WO2014/123197
Patent document 6: JP-A-2014-168949
Patent document 7: JP-A-2014-168950

OUTLINE OF THE INVENTION

Problems that the Invention is to Solve

It is, therefore, an object of the present invention to provide a water barrier laminate provided with inorganic barrier layers and water-trapping layers, exhibiting a barrier property not only against the water that flows through the laminate in the direction of thickness thereof but also against the water that flows in from the side surfaces thereof and, therefore, realizing a super barrier property against the water.

Means for Solving the Problems

According to the present invention, there is provided a water barrier laminate that includes a plastic base material and that is used being so arranged that an outer surface thereof faces an atmosphere of a high water content and an inner surface thereof faces an atmosphere of a relatively low water content, wherein:

a first inorganic barrier layer, a water-trapping layer and a second inorganic barrier layer are formed in this order on the inner surface side of the plastic base material;

an auxiliary water-trapping layer is formed on the inner surface side of the second inorganic barrier layer to trap the water from the side surface; and the auxiliary water-trapping layer faces the atmosphere of the low water content or is located in a region at a distance of not more than 20 μm from the surface that faces the atmosphere of the low water content.

As will be understood from the above description, the water barrier laminate of the present invention is used being so arranged that the outer surface thereof faces the atmosphere of a high water content and the inner surface thereof faces the atmosphere of a low water content. In the present invention, therefore, the inner surface side of the layers stands for a region that is located on the side of the atmosphere of the low water content while the outer surface side of the layers stands for a region that is located on the side of the atmosphere of the high water content.

The water barrier laminate of the present invention can favorably employ the following embodiments.
(1) The first inorganic barrier layer and the second inorganic barrier layers are, respectively, vapor-deposited films;
(2) The auxiliary water-trapping layer is formed in a thickness of 10 to 300% that of the water-trapping layer;

(3) Both the water-trapping layer and the auxiliary water-trapping layer have a structure in which a moisture-absorbing agent is dispersed in a moisture-absorbing matrix that comprises an ionic polymer, the moisture-absorbing agent being capable of attaining a humidity lower than that attained by the matrix;

(4) An organic layer is provided under the second inorganic barrier layer and is neighboring thereto;

(5) An organic layer having a water-diffusing function is formed in a thickness of not less than 10 μm between the first inorganic barrier layer and the water-trapping layer and/or between the second inorganic barrier layer and the auxiliary water-trapping layer;

(6) The water-diffusing layer contains a polyester resin or an olefin resin, and has a water vapor permeation coefficient of not more than 2.0 g·mm/m²·day/atm;

(7) A third inorganic barrier layer is formed on the inner surface side of the auxiliary water-trapping layer;

(8) An organic layer is provided between the third inorganic barrier layer and the auxiliary water-trapping layer;

(9) The third inorganic barrier layer is a cured film of a coating composition that contains a polysilazane and a fluorine-free hydrophobic resin that is not reactive with the polysilazane; and

(10) The cured film is forming such a gradient of atomic concentrations that a concentration of silicon atoms gradually decreases while a concentration of carbon atoms gradually increases from a surface on the side of the atmosphere of the low water content toward a surface on the side of the auxiliary water-trapping layer as expressed on a basis of the four kinds of atoms of silicon atoms, nitrogen atoms, carbon atoms and oxygen atoms.

Effects of the Invention

The water barrier laminate of the present invention has a structure in which a first inorganic barrier layer, a water-trapping layer and a second inorganic barrier layer are formed in this order on a plastic base material. The water barrier laminate of the invention is used, for example, being fitted to the devices that must avoid the infiltration of water. Namely, the water barrier laminate is so fitted to the devices that the plastic base material side is located on the side of the atmosphere of a high humidity and the side of the first inorganic barrier layer is located on the side of the atmosphere of a low humidity (concretely, on the side of the device surface). This structure makes it possible to effectively shut off the water flowing in from the direction of thickness of the laminate (water flowing toward the side of the device surface).

However, the above structure alone is not still capable of effectively shutting off the water flowing in from the side surface of the laminate. For example, the above layer structure, in many cases, is, further, provided with an organic layer having a barrier function or another inorganic barrier layer at a position on the inner surface side relative to the water-trapping layer in order to further improve the barrier property. In such a case, in particular, the inorganic barrier layer is formed by vacuum evaporation necessitating, therefore, the provision of a layer that serves as an underlying layer. This, therefore, causes an increase in the distance between the water-trapping layer and the inner surface that faces the atmosphere of a low humidity (that faces the device surface) making it no longer possible to neglect the water that flows in from the side surface (end surface) of the above portion.

With the water-barrier laminate of the present invention, on the other hand, the auxiliary water-trapping layer is provided on the surface that faces the low-humidity atmosphere (that faces the surface of the device) or at a position close to the surface thereof (within a distance of not more than 20 μm from the surface). Therefore, it is made possible to effectively shut off the water flowing from the above-mentioned side surface, too, and, as a result, to maintain a very high degree of water shut-off property.

Besides, in case the distance is very small (not more than 5 μm) between the auxiliary water-trapping layer and the low-humidity atmosphere (inner surface of the device), the water barrier laminate exhibits the effect of desiccating the water present in the device (water that has entered when the device is fabricated or the water that has permeated through the sealing resin) enabling the life of the device to be further lengthened.

The above water barrier laminate of the present invention can be effectively used for a variety of kinds of devices that must not allow the infiltration of water, and is useful as a substrate or a sealing layer for various kinds of devices. The water barrier laminate of the invention can be particularly favorably used for the organic electroluminescent (organic EL) panels, too.

MODES FOR CARRYING OUT THE INVENTION

Figure 1:
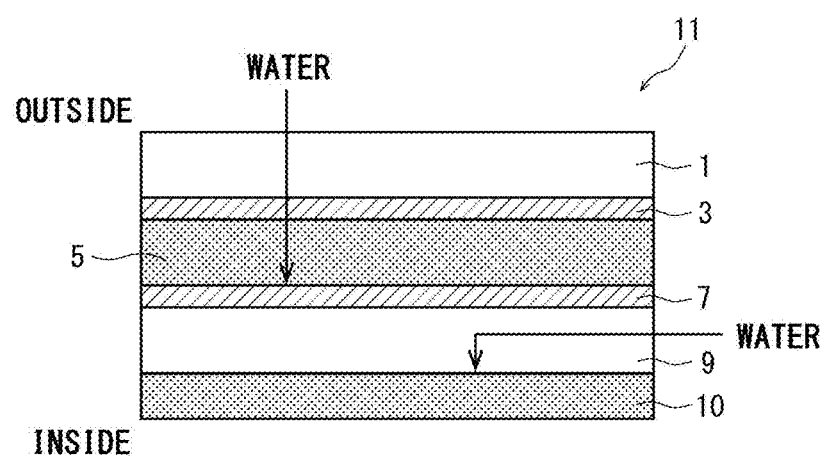
FIG. 1 is a schematic sectional view showing a representative basic structure of layers of a water barrier laminate of the present invention (see Example 20).

Referring to FIG. 1, the water barrier laminate of the present invention generally designated at 11 has a basic structure of layers in which a first inorganic barrier layer 3, a water-trapping layer 5 and a second inorganic barrier layer 7 are formed on a plastic base material 1 and, further, an auxiliary water-trapping layer 10 is formed via an organic layer 9 that serves as an underlying layer for the second inorganic barrier layer 7.

As will be understood from FIG. 1, further, the water barrier laminate 11 is used being so arranged that the outer surface side of the plastic base material 1 is located on the side of the atmosphere of a high humidity (i.e., on the outer side when fitted to a device or the like) and that the auxiliary water trapping layer 10 which is on the inner surface side of the plastic base material 1 is located on the side of the atmosphere of a relatively low humidity (i.e., on the side that faces the surface of the device when fitted to the device).

With the above water barrier laminate 11, the water flowing in the direction of thickness from the outer side is shut off by the water-trapping layer 5. Besides, the auxiliary water-trapping layer 10 shuts off the water that flows from the side surface (end surface) of a portion on the inside of the water-trapping layer 5.

Moreover, in case the distance is particularly small (not more than 5 μm) between the auxiliary water-trapping layer 10 and the low-humidity atmosphere (atmosphere on the inner surface of the device), the water barrier laminate 11 exhibits the effect of desiccating the water present on the inner surface of the device.

<Plastic Base Material 1>

The plastic base material 1 is made from a thermoplastic or thermosetting resin that is known per se., and is formed by such a method as injection or co-injection forming, extrusion or co-extrusion forming, film- or sheet-forming, compression forming or casting polymerization depending on the form thereof. Generally, however, from the standpoint of formability and cost, the plastic base material 1 is formed by using polyolefins or cyclic olefin copolymers such as low-density polyethylene, high-density polyethylene, polypropylene, poly 1-butene, poly 4-methyl-1-pentene or random or block copolymers of α-olefins like ethylene, propylene, 1-butene and 4-methyl-1-pentene; ethylene•vinyl compound copolymers such as ethylene•vinyl acetate copolymer, ethylene vinyl alcohol copolymer, and ethylene•vinyl chloride copolymer; styrene type resins such as polystyrene, acrylonitrile•styrene copolymer, ABS, and α-methylstyrene•styrene copolymer; polyvinyl compounds such as polyvinyl chloride, polyvinylidene chloride, vinyl chloride•vinylidene chloride copolymer, methyl polyacrylate and methyl polymethacrylate; polyamides such as nylon 6, nylon 6-6, nylon 6-10, nylon 11 and nylon 12; thermoplastic polyesters such as polyethylene terephthalate (PET), polybutylene terephthalate and polyethylene naphthalate (PEN); polycarbonates; polyphenylene oxides; biodegradable resins such as polyimide resin, polyamideimide resin, polyetherimide resin, fluorine-contained resin, allyl resin, polyurethane resin, cellulose resin, polysulfone resin, polyethersulfone resin, ketone resin, amino resin and polylactic acid; as well as blends thereof and those resins suitably modified by being copolymerized (e.g., olefin resins modified with acids).

It is, further, desired that the plastic base material 1 is made from a gas-barrier resin having excellent oxygen-barrier property, such as ethylene vinyl alcohol copolymer. Or the plastic base material 1 may have a multilayered structure including a layer formed by using the gas-barrier resin.

In the present invention, it is, further, preferred to use, as the plastic base material 1, a polyester resin as represented by polyethylene terephthalate (PET) or an olefin resin as represented by polypropylene from the standpoint of easy availability, cost, formability, barrier property against oxygen to some extent, and adaptability for use as an underlying layer for the inorganic barrier layer that will be described later.

<First and Second Inorganic Barrier Layers 3 and 7>

There is no particular limitation on the first inorganic barrier layer 3 and the second inorganic barrier layer 7 that are holding the water-trapping layer 5 therebetween being provided on the inner surface side of the plastic base material 1 (on the side opposite to the surface facing the high-humidity atmosphere) so far as they are formed by using an inorganic material. Usually, however, from the standpoint of formability, the first and second inorganic barrier layers 3 and 7 are inorganic vapor-deposited films such as of various metals or metal oxides formed by physical vapor deposition as represented by sputtering, vacuum evaporation or ion plating, or chemical vapor deposition as represented by plasma CVD as disclosed in, for example, JP-A-2015-96320. Specifically, these inorganic barrier layers are vapor-deposited films formed by the plasma CVD from such a standpoint that they are uniformly formed even on rugged surfaces, and they exhibit excellent barrier property not only against the water but also against oxygen and the like.

In the embodiment of FIG. 1, for example, the first inorganic barrier layer 3 is formed by vacuum evaporation on the surface of the plastic base material 1 (inner surface side) which, in this case, is the underlying layer, and the second inorganic barrier layer 7 is formed by vacuum evaporation on the organic layer 9.

To deposit the film by the plasma CVD, the base material on which the inorganic barrier layer is to be formed is arranged in a plasma-treating chamber held at a predetermined degree of vacuum, a gas (reaction gas) of a metal or a compound containing the metal for forming the film and an oxidizing gas (usually, oxygen or NOx gas) are fed together with a carrier gas such as argon, helium or the like gas, through a gas feed pipe, into the plasma-treating chamber that is shielded with a metal wall and is reduced to a predetermined degree of vacuum. In this state, a microwave electric field or a high-frequency electric field is applied to generate a glow discharge and, therefore, to generate a plasma by the electric energy thereof so that the decomposed reaction product of the compound is deposited on the surface of the plastic base material to form a film thereof.

As the reaction gas, there is usually used a gas of an organometal compound from the standpoint of forming, on the interface to the underlying base material, a film having a flexible region containing carbon and a region of a high degree of oxidation and excellent barrier property on the above region. Namely, there is preferably used a gas of an organoaluminum compound such as trialkylaluminum or a gas of an organotitanium compound, organozirconium compound or organosilicon compound. Specifically, it is most desired to use a gas of the organosilicon compound from the standpoint of relatively easily and efficiently forming the inorganic barrier layer 3 or 7 having a high degree of barrier property against oxygen.

As the organosilicon compound, there can be used organosilane compounds such as hexamethyldisilane, vinyltrimethylsilane, methylsilane, dimethylsilane, trimethylsilane, diethylsilane, propylsilane, phenylsilane, methyltriethoxysilane, vinyltriethoxysilane, vinyltrimethoxysilane, tetramethoxysilane, tetraethoxysilane, phenyltrimethoxysilane, methyltrimethoxysilane and methyltriethoxysilane; and organosiloxane compounds such as octamethylcyclotetrasiloxane, 1,1,3,3-tetramethyldisiloxane and hexamethyldisiloxane. There can be, further, used aminosilane, silazane and the like.

The above organometal compounds can be used alone or in a combination of two or more kinds.

The thickness of the first inorganic barrier layer 3 and the second inorganic barrier layer 7 may vary depending on the use of the water barrier laminate or the required level of barrier property but is, usually, such that properties of the plastic base material 1 and the organic layer 9 that serve as the underlying layer during the vacuum evaporation are not impaired and that a water vapor permeability is maintained to be not more than $10^{-2}$ g/m$^2$·day/atom and, specifically, not more than $10^{-3}$ g/m$^2$·day/atom. Though dependent upon the ratio occupied by the above highly oxidized region, the thickness of the inorganic barrier layer 3, 7 is 4 to 500 nm and, specifically, about 30 to about 400 nm.

<Water-Trapping Layer 5>

The water-trapping layer 5 works to trap the water that flows in the direction of thickness of the water barrier laminate 11. Any known layer can be used without specific limitation as the water-trapping layer 5 provided it is capable of trapping the water, such as the one obtained by dispersing a moisture-absorbing agent such as zeolite in a predetermined resin layer. If a particularly high barrier property is required against the water, there can be, desirably, used a layer of a structure in which an ionic polymer disclosed, for example, in JP-A-2015-96320 serves as a matrix, and a moisture-absorbing agent is dispersed in the matrix, the moisture-absorbing agent being capable of attaining humidity to a degree lower than that attained by the ionic polymer. By using such an ionic polymer as the matrix, the layer exhibits excellent water-trapping property yet effectively avoiding deformation such as swelling that is caused after having absorbed the water.

Figures 2A, 2B:
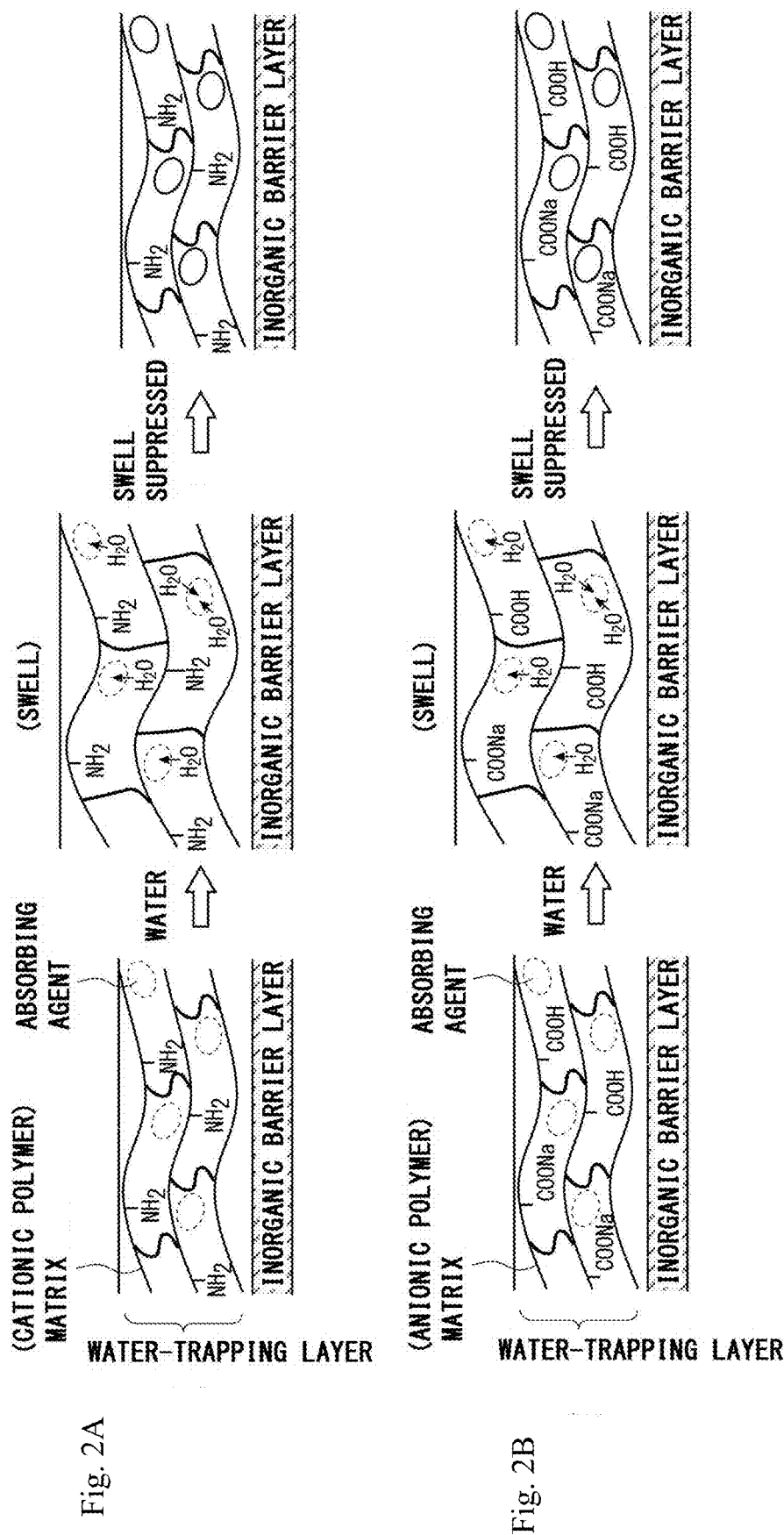
FIGS. 2A and 2B are views illustrating the functions of a water-trapping layer that is most favorably used in the water barrier laminate of the present invention.

FIGS. 2A and 2B show structures of the water-trapping layer of when the above ionic polymer is used as the matrix. FIG. 2A shows a water-trapping layer using, as the matrix, a cationic polymer having cationic groups ($NH_2$ groups, etc.) as the ionic groups while FIG. 2B shows a water-trapping layer using, as the matrix, an anionic polymer having anionic groups (COONa groups, COOH groups, etc.) as the ionic groups.

Namely, in the water-trapping layer 5 that uses the above ionic polymer as the matrix, a trace amount of water that has flown through the above first inorganic barrier layer 3 is absorbed by the matrix (ionic polymer). Since the matrix by itself absorbs the moisture to a high degree, the first inorganic barrier layer traps and absorbs the water without permitting it to be released.

Here, if the water is simply absorbed by the matrix, then the absorbed water may be easily released due to a change in the environment such as a rise in temperature. Besides, as the water infiltrates, gaps among the polymer molecules forming the matrix might expand and, as a result, the water-trapping layer 5 may swell.

However, with the moisture-absorbing agent being dispersed in the matrix to attain a humidity to a degree lower than that in the matrix (ionic polymer), the water absorbed in the matrix is, further, trapped by the moisture-absorbing agent that absorbs the moisture more (i.e., attains the humidity to a degree lower) than the matrix. Therefore, the water-trapping layer 5 is effectively suppressed from being swollen by the absorbed water molecules. Besides, the water molecules are confined in the water-trapping layer 5. As a result, the water-trapping layer 5 effectively prevents the water from being released.

As described above, when the water-trapping layer 5 is formed by dispersing the moisture-absorbing agent in the ionic polymer, there are exhibited double functions, i.e., a high moisture-absorbing capability and confinement of the water. This makes it possible to trap the water even in an atmosphere of a very low humidity and to trap the water at a rate very larger than a rate at which the water permeates through the inorganic barrier layer. Moreover, the layer as a whole traps the water without permitting it to be released to the exterior. Thus, a very high degree of water barrier capability is realized.

When the water-trapping layer 5 has reached a saturated amount of water, the water that flows in the direction of thickness can be shut off by the second inorganic barrier layer 7 formed on the inside of the water-trapping layer 5 and by the auxiliary water-trapping layer 10 that will be described later.

Ionic Polymer (Cationic Polymer);

In the present invention, among the ionic polymers used for forming the above matrixes, the cationic polymer is a polymer having in the molecules thereof cationic groups that could turn into a positive electric charge in water, such as primary to tertiary amino groups, quaternary ammonium groups, pyridyl groups, imidazole groups or quaternary pyridinium groups. The above cationic polymer contains the cationic groups that have a strong nucleophilic action and trap water due to its hydrogen bond. Therefore, the above cationic polymer forms the moisture-absorbing matrix.

The amount of the cationic groups in the cationic polymer should be, usually, such that the water absorption (JIS K-7209-1984) of the moisture-absorbing matrix that is formed is not less than 20% and, specifically, 30% to 45% in an atmosphere of a humidity of 80% RH and 30° C.

As the cationic polymer, further, there is used the one that is obtained by polymerizing or copolymerizing at least one kind of cationic monomers as represented by amine type monomers such as allylamine, ethyleneimine, vinylbenzyltrimethylamine, [4-(4-vinylphenyl)-methyl]-trimethylamine and vinylbenzyltriethylamine; nitrogen-containing heterocyclic monomers such as vinylpyridine and vinylimidazole; and salts thereof, together with other monomers copolymerizable therewith and, further as required, partly neutralizing the formed polymer with an acid.

As other monomers copolymerizable therewith, though not limited thereto only, there can be exemplified styrene, vinyltoluene, vinylxylene, α-methylstyrene, vinylnaphthalene, α-halogenated styrenes, acrylonitrile, acrolein, methyl vinyl ketone, and vinylbiphenyl.

Instead of using the above cationic monomers, it is also allowable to use a monomer having a functional group capable of introducing a cationic functional group, such as styrene, bromobutylstyrene, vinyltoluene, chloromethylstyrene, vinylpyridine, vinylimidazole, α-methylstyrene and vinylnaphthalene. After the polymerization thereof, the polymer thereof is subjected to the treatment such as amination or alkylation (chlorination with quaternary ammonium) to obtain a cationic polymer thereof.

In the invention, among the above-mentioned cationic polymers, the allylamine is particularly desired from the standpoint of film formability.

In the present invention, it is desired to introduce a crosslinked structure into the matrix that is formed by using the above cationic polymer from the standpoint of maintaining a mechanical strength without lowering the moisture-absorbing capability and, at the same time, improving the dimensional stability.

That is, upon introducing the crosslinked structure into the moisture-absorbing matrix, molecules of the cationic polymer are locked by each other due to the crosslinking when the matrix has absorbed the water, and suppress a change in the volume caused by swelling (absorption of water) bringing about an improvement in the mechanical strength and the dimensional stability.

The crosslinked structure can be introduced by adding a crosslinking agent to the coating composition for forming the water-trapping layer 5.

Ionic Polymer (Anionic Polymer);

In the present invention, the anionic polymer used for forming the moisture-absorbing matrix is a polymer that has in the molecules thereof an anionic functional group that could become a negative electric charge in water, such as carboxylic acid group, sulfonic acid group, phosphonic acid group, or acid base formed by partly neutralizing the above bases. The anionic polymer having such a functional group can form a moisture-absorbing matrix since the functional group traps water based on its bonding with hydrogen.

The amount of the anionic functional groups in the anionic polymer, though dependent on the kind of the functional groups, may be such that the water absorption (JIS K-7209-1984) of the moisture-absorbing matrix that is formed is not less than 20% and, specifically, 30% to 45% in an atmosphere of a humidity of 80% RH and 30° C.

As the anionic polymer having the above functional groups, there is used the one obtained by polymerizing or copolymerizing at least one kind of an anionic monomer as represented by a carboxylic acid monomer such as methacrylic acid, acrylic acid, or anhydrous maleic acid; sulfonic acid monomer such as α-halogenated vinylsulfonic acid, styrenesulfonic acid or vinylsulfonic acid; phosphonic acid monomer such as vinylphosphoric acid; or salts of monomers thereof; with other copolymerizable monomers and, further, as required, followed by the partial neutralization by the treatment with an alkali.

As the other copolymerizable monomers, though not limited thereto only, there can be exemplified styrene, vinyltoluene, vinylxylene, α-methylstyrene, vinylnaphthalene, α-halogenated styrenes, acrylonitrile, acrolein, methyl vinyl ketone and vinylbiphenyl.

Instead of using the above anionic monomers, it is also allowable to obtain the anionic polymer by using an ester of the above anionic monomer or a monomer having a functional group capable of introducing an anionic functional group, such as styrene, vinyltoluene, vinylxylene, α-methylstyrene, vinylnaphthalene or α-halogenated styrenes and after the polymerization thereof, conducting such a treatment as hydrolysis, sulfonation, chlorosulfonation, or phosphoniation.

The anionic polymer preferably used in the present invention is a poly(meth)acrylic acid or a partly neutralized product thereof (e.g., a product thereof which is partly an Na salt).

In the present invention, it is desired that a crosslinked structure has been introduced into the moisture-absorbing matrix formed by using the above anionic polymer from the standpoint of further improving the water-trapping capability of the water-trapping layer 5 and further improving the dimensional stability.

That is, in the case of the anionic polymer unlike the case of the cationic polymer, the water is trapped by only the hydrogen bond. By introducing a spatial mesh structure (crosslinked structure) adapted to absorbing moisture, therefore, the moisture-absorbing capability can be greatly improved. Such a crosslinked structure has a hydrophobic portion like alicyclic structure in the mesh structure thereof, and enables the hydrophilic portion to exhibit further improved moisture-absorbing effect.

Moreover, with the crosslinked structure being introduced into the moisture-absorbing matrix, molecules of the anionic polymer are locked by each other due to the crosslinking when the matrix has absorbed water. This suppresses a change in the volume caused by swelling (absorption of water) and brings about an improvement in the dimensional stability. The effect of improving the dimensional stability is the same as that of the case of the cationic polymer described above.

The above crosslinked structure, like in the case of the cationic polymer, can be introduced by adding a crosslinking agent to the coating composition that forms the water-trapping layer 5.

Moisture-Absorbing Agent;

The moisture-absorbing agent is dispersed in the water-trapping layer 5 that uses the above ionic polymer as the matrix. The moisture-absorbing agent is capable of attaining a humidity lower than a humidity that can be attained by using the ionic polymer (cationic polymer or anionic polymer) that forms the matrix and, therefore, exhibits a very high moisture-absorbing capability. Namely, the water-trapping layer 5 contains, dispersed therein, the moisture-absorbing agent having moisture-absorbing property stronger than that of the matrix. Therefore, the water absorbed by the matrix formed by the above-mentioned ionic polymer is readily trapped by the moisture-absorbing agent; i.e., water that is absorbed is effectively confined within the matrix. Accordingly, the water-trapping layer 5 effectively exhibits the water-absorbing capability even in an atmosphere of a very low humidity and, besides, is effectively suppressed from swelling despite it has absorbed the water.

As the moisture-absorbing agent that highly adsorbs the moisture, there can be preferably used those that can attain a humidity of not higher than 6% in an environment of a humidity of 80% RH and a temperature of 30° C. provided that they can attain a humidity lower than a humidity that can be attained by using the ionic polymer as demonstrated, for example, in Examples appearing later. If the humidity attained by using the moisture-absorbing agent is higher than a humidity that is attained using the ionic polymer, then the water absorbed by the matrix cannot be confined to a sufficient degree but tends to be released, and greatly improved water barrier property cannot be expected. Further, despite the humidity that is attained is lower than that attained by the ionic polymer, water in an atmosphere of a low humidity cannot be trapped to a sufficient degree if the attained humidity measured under the above condition is higher than the above range. In this case, the water in the atmosphere of a low humidity cannot be trapped to a sufficient degree and water barrier property cannot often be exhibited to a sufficient degree.

The above moisture-adsorbing agent, usually, has a water absorption (JIS K-7209-1984) of not less than 50% in an environment of a humidity of 80% RH and a temperature of 30° C., and is either inorganic or organic.

As the inorganic moisture-absorbing agent, there can be exemplified clay minerals such as zeolite, alumina, activated charcoal and montmorillonite, as well as silica gel, calcium oxide and magnesium sulfate.

As the organic moisture-absorbing agent, there can be exemplified an anionic polymer or a crosslinked product of a partly neutralized product thereof. As the anionic polymer, there can be exemplified the one obtained by polymerizing at least one of the anionic monomers represented by carboxylic acid monomer ((meth)acrylic acid, anhydrous maleic acid, etc.), sulfonic acid monomers (halogenated vinyl sulfonate, styrenesulfonic acid, vinyl sulfonate, etc.), phosphonic acid monomers (vinylphosphoric acid, etc.) or salts of monomers thereof, or copolymerizing it with other monomers. Specifically, in the use where transparency is required, an organic moisture-absorbing agent is effectively used. For instance, fine particles of a crosslinked sodium poly(meth)acrylate can be representatively used as the organic moisture-absorbing agent.

In the invention, it is desired to use a moisture-absorbing agent having a small particle size (e.g., average primary particle size of less than 100 nm and, specifically, less than 80 nm) from the standpoint of attaining a large specific surface area and high moisture-absorbing property, and most desirably to use a moisture-absorbing agent of an organic polymer having a small particle size.

That is, the moisture-absorbing agent of the organic polymer disperses very well in the matrix of the ionic polymer, i.e., disperses homogeneously. Besides, by employing an emulsion polymerization or a suspension polymerization as a polymerization method for the production thereof, the moisture-absorbing agent can be obtained in a fine particulate shape and in a uniform spherical shape. By adding the moisture-absorbing agent of the organic polymer in more than a certain amount, it is made possible to realize a very high degree of transparency.

Further, the organic fine moisture-absorbing agent can attain a very low humidity, has a high moisture-absorbing property, changes the volume very little despite it is swollen since it has been crosslinked and is, therefore, best adapted to bringing the environmental atmosphere to the absolutely dry state or to lowering the humidity close to the absolutely dry state yet suppressing a change in the volume.

As fine particles of the organic moisture-absorbing agent, there have been placed in the market fine particles of crosslinked Na polyacrylate (average particle size of about 70 nm) in the form of a colloidal dispersion solution (pH=10.4) in the trade name of TAFTIC HU-820E by Toyobo Co.

In the present invention, amount of the moisture-absorbing agent is determined depending on the kind of the ionic polymer from the standpoint of exhibiting its properties to a sufficient degree, greatly improving the water barrier property, effectively suppressing a change in the size caused by swelling, and maintaining the water barrier property higher than the water barrier property of the inorganic barrier layer over extended periods of time.

For instance, in the case of the water-trapping layer 5 in which the above ionic polymer is used as the matrix and the moisture-absorbing agent is dispersed in the matrix, the water-trapping layer 5 is formed in a thickness (e.g., not less than 1 μm and, specifically, about 2 to about 20 μm) large enough to exhibit such a super-barrier property that the water vapor permeability is not more than $10^{-5}$ g/m$^2$/day in a use where particularly high water barrier property is required. When the matrix is formed by using the cationic polymer, however, moisture-absorbing agent is used in an amount of not less than 50 parts by weight, specifically, in an amount of 100 to 900 parts by weight and, more preferably, in an amount of 200 to 600 parts by weight per 100 parts by weight of the ionic polymer in the water-trapping layer 5. Further, when the matrix is formed by using the anionic polymer, the moisture-absorbing agent is used in an amount of not less than 50 parts by weight, specifically, in an amount of 100 to 1300 parts by weight and, more preferably, in an amount of 150 to 1200 parts by weight per 100 parts by weight of the anionic polymer in the moisture-absorbing layer 5.

Forming the Water-Trapping Layer 5;

The above-mentioned water-trapping layer 5 can be formed by various methods. For instance, a resin composition is prepared by dispersing a moisture-absorbing agent in a thermoplastic resin that serves as the matrix, and from which a film is formed. Then, by using an adhesive for dry lamination, such as urethane type adhesive, the film is laminated on the first inorganic barrier layer 3 or the second inorganic barrier layer 7 by dry lamination. When it is attempted to form the water-trapping layer 5 using the above ionic polymer as the matrix, a coating composition is prepared by dissolving or dispersing the ionic polymer that serves as the matrix and the moisture-absorbing agent in the solvent. The coating composition is then applied on, for example, the first inorganic barrier layer 3 followed by drying to remove the solvent. Thereafter, in the same manner as described above, the surface thereof on the opposite side is laminated on the second inorganic barrier layer 7 by dry lamination to thereby form the desired water-trapping layer 5.

In the water-trapping layer 5 using the ionic polymer as described above, it is desired that a crosslinked structure has been introduced into the matrix of the ionic polymer by using a crosslinking agent in order to more effectively prevent the absorbed water from being released and to more effectively prevent the deformation caused by swelling.

The coating composition for forming the water-trapping layer 5 has been described in JP-A-2015-96320, and may slightly differ depending on when the matrix is formed by using the cationic polymer (hereinafter simply called "cationic matrix") or when the matrix is formed by using the anionic polymer (hereinafter simply called "anionic matrix").

In the Case of the Cationic Matrix;

The coating composition contains the cationic polymer and the moisture-absorbing agent at the above-mentioned ratio. Namely, the cationic polymer and the moisture-absorbing agent are contained in the coating composition in amounts mentioned above per 100 parts by weight of the cationic polymer.

Moreover, a siloxane structure or a polyalicyclic structure can be introduced into the crosslinked structure by using a crosslinking agent which is for introducing the crosslinked structure into the moisture-absorbing matrix of the cationic polymer. A special mesh structure adapted to absorbing the moisture can be thus formed.

As the crosslinking agent in this case, there can be used a compound having a crosslinking functional group (e.g., epoxy group) capable of reacting with the cationic group and a functional group (e.g., alkoxysilyl group) capable of forming a siloxane structure in the crosslinked structure through the hydrolysis and through the dehydrating condensation. As the crosslinking agent, specifically, there can be favorably used a silane compound represented by the following formula (1):

$$X\text{—}SiR^1{}_n(OR^2)_{3-n} \quad (1)$$

wherein X is an organic group having an epoxy group at the terminal thereof,

R$^1$ and R$^2$ are, independently, methyl groups, ethyl groups or isopropyl groups, and n is 0, 1 or 2.

The above silane compound has an epoxy group and an alkoxysilyl group as functional groups, and the epoxy group undergoes the addition reaction with a functional group (e.g., NH$_2$) of the cationic polymer. On the other hand, the alkoxysilyl group forms a silanol group (SiOH group) through the hydrolysis, and grows by forming the siloxane structure through the condensation reaction to finally form a crosslinked structure among the cationic polymer chains. The crosslinked structure having the siloxane structure is thus introduced into the matrix of the cationic polymer.

Besides, the coating composition contains the cationic polymer and is alkaline accelerating, therefore, the addition reaction of the cationic group with the epoxy group or the dehydration•condensation among the silanol groups.

In the invention, the organic group X having the epoxy group in the above formula (1) can be represented by a γ-glycidoxyalkyl group. For instance, γ-glycidoxypropyltrimethoxysilane and γ-glycidoxypropylmethyldimethoxysilane can be favorably used as crosslinking agents.

Further, the compound of the above formula (1) in which the epoxy group is an alicyclic epoxy group such as epoxycyclohexyl group, too, can be favorably used as the crosslinking agent. For instance, if a compound having an alicyclic epoxy group such as β-(3,4-epoxycyclohexyl)ethyltrimethoxysilane is used as the crosslinking agent, the siloxane structure as well as the alicyclic structure can be introduced into the crosslinked structure of the matrix. Introduction of the alicyclic structure helps more effectively to realize the function of the matrix which is to form the spatial mesh structure adapted to absorbing the moisture.

To introduce the alicyclic structure into the crosslinked structure, there can be used, as the crosslinking agent, a compound having a plurality of epoxy groups and alicyclic groups, e.g., a diglycidyl ester represented by, for example, the following formula (2):

$$G\text{-}O(C\!=\!O)\text{-}A\text{-}(C\!=\!O)O\text{-}G \quad (2)$$

wherein G is a glycidyl group, and

A is a divalent hydrocarbon group having an aliphatic ring, such as cycloalkylene group.

Representative examples of the diglycidyl ester are expressed by the following formula (2-1).

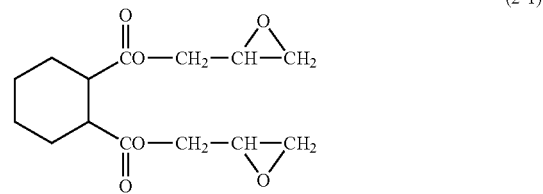

(2-1)

The diglycidyl ester of the formula (2) has no alkoxysilyl group but works to introduce the alicyclic structure into the crosslinked structure, and is effective from the standpoint of forming, in the matrix, a spatial mesh structure that is adapted to absorbing the moisture.

In the coating composition forming the cationic matrix, it is desired that the crosslinking agent is used in an amount of 5 to 60 parts by weight and, specifically, 15 to 50 parts by weight per 100 parts by weight of the cationic polymer and that at least not less than 70% by weight and, preferably, not less than 80% by weight of the crosslinking agent is the silane compound of the formula (1) described above.

If the crosslinking agent is used in too large amounts, the matrix becomes brittle in terms of the mechanical strength and less easy to handle. If prepared in the form of a coating material, the composition quickly becomes so viscous that a sufficiently long pot life cannot be guaranteed. If the crosslinking agent is used in too small amounts, on the other hand, it may become difficult to maintain the resistance (e.g., mechanical strength) in severe environments (e.g., under highly humid conditions).

Any solvent can be used without limitation for the coating composition that contains the above-mentioned components provided it can be volatilized and removed upon being heated at a relatively low temperature. For instance, there can be used an alcoholic solvent such as methanol, ethanol, propyl alcohol or butanol; ketone solvent such as acetone or methyl ethyl ketone; a mixed solvent of the above solvents and water; water; or an aromatic hydrocarbon solvent such as benzene, toluene or xylene. Specifically, it is desired to use the water or a mixed solvent containing the water to accelerate the hydrolysis of the silane compound having alkoxysilyl group in the crosslinking agent in the coating composition.

The above solvent is used in such an amount that the coating composition assumes a viscosity suited for being applied. Here, however, it is also allowable to add a nonionic polymer in a suitable amount to adjust the viscosity of the coating composition or to adjust the water absorption of the formed moisture-absorbing matrix to lie in a suitable range.

As the non-ionic polymer, there can be exemplified saturated aliphatic hydrocarbon polymers such as polyvinyl alcohol, ethylene-propylene copolymer and polybutylene; styrene type polymers such as styrene-butadiene copolymer, etc.; polyvinyl chloride; and those obtained by copolymerizing the above polymers with various comonomers (e.g., styrene type monomers such as vinyltoluene, vinylxylene, chlorostyrene, chloromethylstyrene, α-methylstyrene, α-halogenated styrene and α,β,β'-trihalogenated styrene; monoolefins such as ethylene and butylene; or conjugated diolefins such as butadiene and isoprene).

In the case of the anionic matrix;

The coating composition for forming the water-trapping layer 5, in this case, contains the anionic polymer and the moisture-absorbing agent in such amounts that the amount of the moisture-absorbing agent lies in the above-mentioned range relative to 100 parts by weight of the anionic polymer.

The coating composition in this case, too, is suitably blended with the crosslinking agent like in the case of the above-mentioned cationic matrix.

As the crosslinking agent, there can be used a compound having two or more crosslinking functional groups (e.g., epoxy groups) capable of reacting with the ionic groups possessed by the anionic polymer. Namely, there can be used the diglycidyl ester represented by the formula (2):

wherein G is a glycidyl group, and
A is a divalent hydrocarbon group having an aliphatic ring, such as cycloalkylene group, that was also exemplified for the coating composition for forming the cationic matrix.

In the diglycidyl ester of the above formula (2), the epoxy group reacts with the anionic group, and a crosslinked structure that includes an alicyclic structure due to the divalent group A is formed in the matrix. The crosslinked structure that includes the alicyclic structure suppresses the layer from swelling.

Among the above diglycidyl esters, preferred examples have already been quoted above, and the most desired example is a diglycidyl ester represented by the following formula (2-1) from the standpoint of forming the spatial mesh structure adapted to absorbing the moisture.

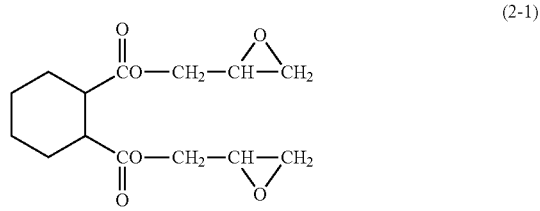

It is desired that the coating composition for forming the anionic matrix contains the crosslinking agent in an amount of 1 to 50 parts by weight and, specifically, 10 to 40 parts by weight per 100 parts by weight of the anionic polymer. If the crosslinking agent is used in too large amounts, the matrix becomes brittle in terms of the mechanical strength and less easy to handle. If prepared in the form of a coating material, the composition quickly becomes so viscous that a sufficiently long pot life cannot be guaranteed. If the crosslinking agent is used in too small amounts, on the other hand, it may become difficult to maintain the resistance (e.g., mechanical strength) in severe environments (e.g., under highly humid conditions).

Any solvent can be used without limitation for the coating composition that contains the above-mentioned components provided it can be volatilized and removed upon being heated at a relatively low temperature. For instance, there can be used those that were exemplified for the coating composition for forming the cationic matrix.

Further, the coating composition for forming the anionic matrix can be added with an alkali (e.g., sodium hydroxide or the like) to adjust the pH. For instance, the alkali can be so added that the pH becomes about 8 to about 12.

Like in the case of the coating composition for forming the cationic matrix, the solvent is used in such an amount that the coating composition acquires a viscosity suited for being applied. Moreover, the above-mentioned non-ionic polymer is added in a suitable amount in order to adjust the viscosity of the coating composition or to adjust the water absorption of the formed moisture-absorbing matrix so as to lie in a suitable range.

Referring to the water barrier laminate 11 having a structure of the laminated layers shown in FIG. 1, the coating composition is used for forming the cationic matrix or the anionic matrix. Namely, the coating composition is applied onto the first inorganic barrier layer 3 or the second inorganic barrier layer 7, and is heated at a temperature of about 80 to about 160° C. The heating time is, usually, from several seconds to several minutes though it varies depending on the ability of the heating device such as heating oven. The solvent is removed by heating and, besides, the crosslinking agent reacts with the ionic polymer to form the water-trapping layer 5 that has the crosslinked structure introduced into the matrix.

<Organic Layer 9>

The organic layer 9 serves as an underlying layer for depositing the second inorganic barrier layer 7 thereon, and can be formed by using the same thermoplastic resin or the thermosetting resin as that used for forming the plastic base material 1.

Usually, from the standpoint of formability and cost, the organic layer 9 is, desirably, formed by using a polyester resin such as polyethylene terephthalate, or an olefin resin such as polypropylene or polyethylene. However, the organic layer 9 can also be formed by using a gas-barrier resin such as ethylene•vinyl alcohol copolymer. Or the organic layer 9 can be formed in a multilayered structure including a gas-barrier layer that is formed by using the gas-barrier resin.

The organic layer 9 takes the form of a film or a sheet that has been known per se., and the second inorganic barrier layer 7 is formed thereon.

Therefore, the organic layer 9 should have a thickness and a heat resistance large enough for withstanding the operation for forming (depositing) the second inorganic barrier layer 7.

Further, it is desired that the organic layer 9 that is formed has a small thickness from such a standpoint that the water flows in as little as possible from the side surfaces (end surfaces) of the organic layer 9. It is, further, desired that the material used for forming the organic layer 9 has a small water vapor permeation coefficient.

In the embodiment of FIG. 1, the organic layer 9 is formed neighboring the inner surface side of the second inorganic barrier layer 7. It is, however, also allowable to form the organic layer 9 neighboring the outer surface side of the second inorganic barrier layer 7.

<Auxiliary Water-Trapping Layer 10>

The auxiliary water-trapping layer 10 is formed on the surface of the inner side, and is exposed to, for example, the surface of a device. The auxiliary water-trapping layer 10 is for trapping the water that flows in from the side surfaces (end surfaces) positioned on the inside of the water-trapping layer 5 or for trapping the water present in the low-humidity atmosphere (atmosphere on the inner surface of the device). Like the water-trapping layer 5, there is no specific limitation on the auxiliary water-trapping layer 10 provided it traps the water; i.e., the auxiliary water-trapping layer 10 can be formed by using any known material. Particularly preferably, however, the auxiliary water-trapping layer 10 uses an ionic polymer as the matrix and has a structure in which the matrix contains, dispersed therein, a moisture-absorbing agent that can attain a humidity lower than that attained by the ionic polymer like in the case of the water-trapping layer 5. Namely, the above layer 10 traps the water excellently, and effectively alleviates the deformation such as swelling caused by the absorption of water. For instance, even after the amount of water trapped by the water-trapping layer 5 has reached a saturated state, the auxiliary water-trapping layer 10 works to effectively block the water flowing in from the direction of thickness of the water barrier laminate 11.

The auxiliary water-trapping layer 10 is provided for blocking the water that flows in from the side surfaces (end surfaces) located on the inside of the water-trapping layer 5 and for trapping the water present inside the device. The water-trapping capability required for the layer varies depending on the constitution of layers of the laminate as well as the structure of the device and the service life thereof. Depending on the conditions, the moisture-absorbing capacity of the auxiliary water-trapping layer 10 is set to be about 10 to about 300% that of the water-trapping layer 5, and the thickness of the auxiliary water-trapping layer 10 is adjusted within the above range.

The auxiliary water-trapping layer 10 can be formed by the same method as that for forming the water-trapping layer 5 depending on the kinds of the materials that form the auxiliary water-trapping layer 10.

<Structure of Layers of the Water Barrier Laminate 11>

The water barrier laminate 11 can assume a variety of layer constitutions yet maintaining a basic structure in that the first inorganic barrier layer 3 and the second inorganic barrier layer 7 are formed on the low-humidity atmosphere side (inside) of the plastic base material 1 that is arranged on the high-humidity atmosphere side (outer side), that the water-trapping layer 5 is formed between the first inorganic barrier layer 3 and the second inorganic barrier layer 7 and, further, that the auxiliary water-trapping layer 10 is formed on the low-humidity atmosphere side (inside) of the second inorganic barrier layer 7.

For instance, a second inorganic barrier layer 7 can be, further, formed between the auxiliary water-trapping layer 10 and the second inorganic barrier layer 7.

It is, further, allowable to form still another layer on the low-humidity atmosphere side (inside) of the auxiliary water-trapping layer 10. In this case, it is necessary that the distance is not more than 20 μm and, specifically, not more than 10 μm between the auxiliary water-trapping layer 10 and the surface (innermost surface) that is exposed to the low-humidity atmosphere. This is because if the distance is large, the amount of water that flows in through the side surfaces (end surfaces) of this portion becomes no longer negligible; i.e., water flows into the low-humidity atmosphere (e.g., into the device).

Moreover, by very decreasing the distance between the auxiliary water-trapping layer 10 and the low-humidity atmosphere side (to be not more than 5 μm), there can be exhibited the effect of desiccating the water present in the low-humidity atmosphere (e.g., in the device).

Therefore, so far as the above distance is maintained in a small range, it is allowed to further provide a third inorganic barrier layer or an organic layer on the inner surface side of the auxiliary water-trapping layer 10 making it possible to further improve the barrier property against oxygen and water.

Specifically, the third inorganic barrier layer that is provided on the innermost surface of the water barrier laminate 11 works effectively to protect the auxiliary water-trapping layer 10. Namely, the third inorganic barrier layer effectively prevents the auxiliary water-trapping layer 10 from being deformed or scratched that might be caused by the absorption of moisture when the water barrier laminate 11 is exposed to the atmosphere or might be caused by accidental external force.

The third inorganic barrier layer may be formed on the innermost surface by vacuum evaporation like the above-mentioned first and second inorganic barrier layers 3 and 7, but may also be formed by coating. That is, the vacuum evaporation necessitates an underlying layer but the coating method does not necessitate any underlying layer and, in this case, the third inorganic barrier layer can be formed directly on the surface of the auxiliary water-trapping layer 10.

When the coating method is employed, the inorganic barrier layer (often called inorganic barrier film) is representatively formed by applying, on a predetermined surface, an organic solvent solution that contains, for example, a polysilazane, a polymerization-condensable silane compound (e.g., alkoxysilane, etc.) and a polymerization-condensable alumina compound (e.g., alkoxyaluminum, etc.) as film-forming components and, further, containing, as required, inorganic fine particles such as of silica or alumina, followed by heating to volatilize the organic solvent.

In the invention, the inorganic barrier film is, preferably, formed by using a coating composition that contains the polysilazane as a film-forming component, and is, particularly preferably, formed by using a coating composition (hereinafter called polysilazane coating composition) that contains the polysilazane and a fluorine-free hydrophobic resin that is non-reactive with the polysilazane from the standpoint of suppressing the occurrence of cracks.

Polysilazane Coating Composition;

The coating composition containing the fluorine-free hydrophobic resin and the polysilazane is applied and is heated to form a film. Here, the film that is formed contains an organic component due to the hydrophobic resin and an inorganic component ($SiO_2$ component) that is formed by the reaction of the polysilazene with the water.

The hydrophobic resin, however, is not reactive with the polysilazane and does not have a reactive group (e.g., OH group) that reacts with the polysilazane. Therefore, the molecules of polysilazane are not locked by the hydrophobic resin. Therefore, the polysilazane bleeds out locally on the surface of the film (on the surface on the side opposite to the underlying surface on where the coating composition is applied) and near the underlying surface.

That is, a cured film is obtained by curing a layer that is formed by applying the coating composition on the underlying surface. The cured film is an organic/inorganic composite film in which the inorganic component ($SiO_2$) formed by the polysilazane is locally present at a high concentration in the organic component that chiefly comprises the hydrophobic resin. Namely, the $SiO_2$ is distributed at a high concentration on the surface of the film creating a state close to that of the $SiO_2$ film formed by, for example, the vacuum evaporation exhibiting, therefore, a high degree of gas-barrier property. That is, the film directly shut off the permeation of gases rather than causing them to detour and, as a result, exhibits a high degree of gas-barrier property.

Moreover, the hydrophobic resin which is an organic component effectively alleviates the occurrence of cracks in the film. The hydrophobic resin is, further, continuing in the film from the surface of the film. Therefore, the $SiO_2$ that is distributed in the surface at a high concentration is effectively prevented from peeling off the surface.

Besides, near the interface to the underlying base material, the locally distributed polysilazane reacts with the polar groups of the underlying base material. As a result, the cured film that is formed excellently adheres to the surface of the underlying base material.

It is thus made possible to effectively alleviate a decrease in the barrier property caused by the occurrence of cracks and a lack of adhesiveness of the film. The $SiO_2$ that is distributed (locally) in the surface at a high concentration helps exhibit a very high degree of gas-barrier property. Being compounded by, for example, humidity resistance of the hydrophobic resin, it becomes possible to suppress the water vapor permeability to a level of not higher than $10^{-1}$ g/m$^2$·day/atm.

Figure 31:
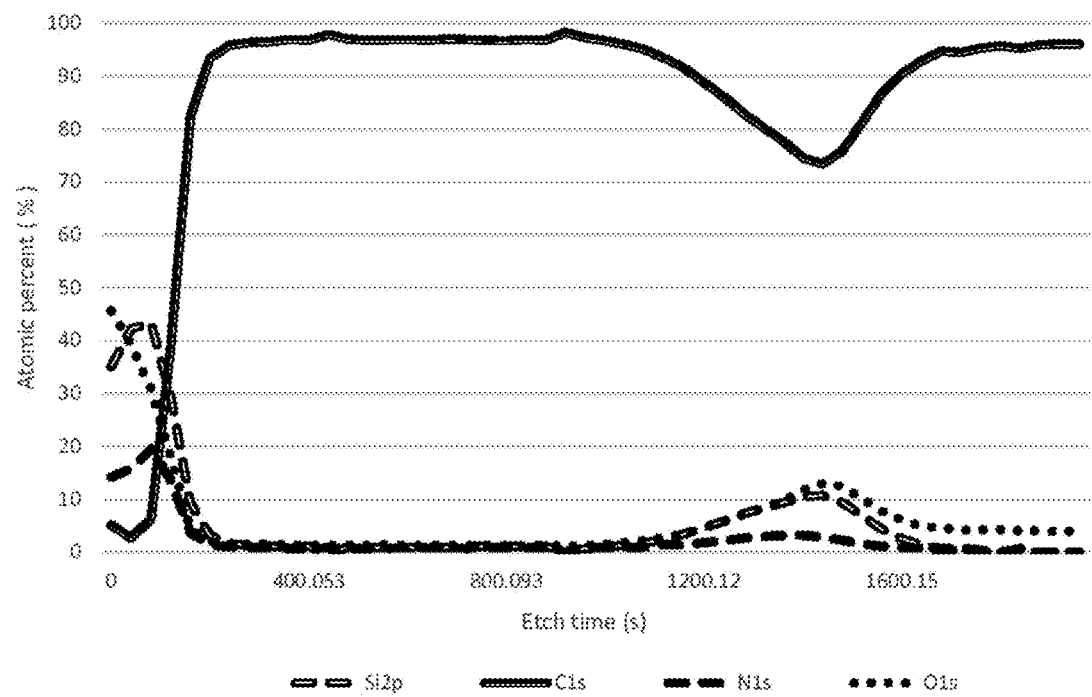
FIG. 31 is a diagram showing the distribution of atoms in an inorganic barrier film (organic/inorganic composite film) formed by using a polysilazane coating composition in the direction of thickness thereof.

The results of experiment shown in FIG. 31 clearly shows a profile of $SiO_2$ concentration in the organic/inorganic composite film formed on the underlying base material by using the polysilazane coating composition.

That is, FIG. 31 shows profiles of concentrations of silicon atoms (Si), carbon atoms (C), oxygen atoms (O) and nitrogen atoms (N) in the direction of thickness of the organic/inorganic composite film as measured by the XPS, the organic/inorganic composite film being formed by applying the coating composition prepared in Reference Experiment 1 onto the surface of the plastic base material followed by curing. In FIG. 31, the abscissa represents the etching time (seconds) and the ordinate represents the concentrations of atoms. At zero etching time, the profile is on the surface of the film and as the etching time passes by, the profile goes deeper in the film.

As will be understood from FIG. 31, the concentration of silicon atoms that corresponds to the $SiO_2$ concentration is high on the surface of the film, decreases gradually toward the interior of the film, and becomes high again near the interface to the underlying base material. On the other hand, the concentration of carbon atoms that corresponds to the hydrophobic resin is very low on the surface of the film, gradually increases toward the interior of the film, and becomes very low again near the interface to the underlying base material.

It will be learned from the above results that most of $SiO_2$ formed by the reaction of the polysilazane with the water is present in the surface of the film; i.e., $SiO_2$ is locally present in the surface of the film and the $SiO_2$ concentration gradually decreases toward the interior of the film.

Further, near the interface to the underlying base material, there is a region where the concentration of silicon atoms is increasing again, from which it is learned that the polysilazane is locally existing in a portion, too, which is close to the interface to the underlying base material.

Polysilazane;

The polysilazane used as a film-forming component in the polysilazane coating composition is also called perhydropolysilazane, expressed by the formula: —$(SiH_2NH)n$-, and has a hydrosilyl group (SiH) and a silazane group (SiN). The polyhydrosilazane of this structure reacts with the water (water in the air) as represented by the following formula, and forms a silicon oxide ($SiO_2$) in which —SiO— is linked like a mesh. That is, the $SiO_2$ formed by the reaction of the polysilazane with the water exhibits a high degree of gas-barrier property without relying on the detouring effect when it is linked in a state close to that of a mesh.

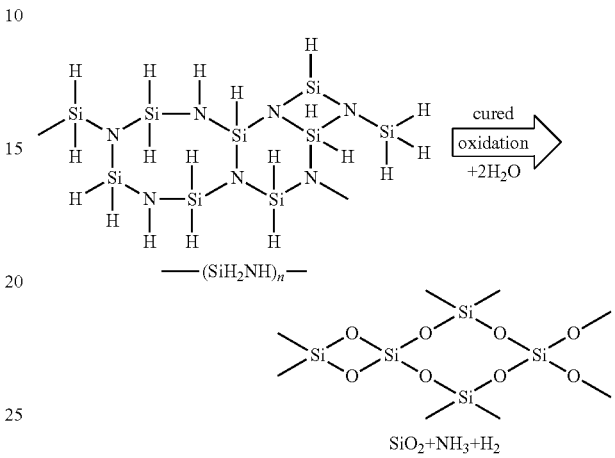

The polysilazane may be introduced by the substitution of an organic group such as alkyl group or the like group with a hydrogen atom, or by the copolymerization of a silicone resin component that is formed by the polycondensation of the alkoxysilane. Introduction of the organic group or the copolymerized component brings about an increase in the flexibility of the film but accompanied by a decrease in the gas-barrier property. Therefore, the amount of introduction of these components should be within a range in which they do not impair the gas-barrier property. For example, the amount of their introduction should be such that the concentration of carbon atoms at a depth of 10 nm from the surface of the film is suppressed to be not more than 10% on the basis of four kinds of atoms of silicon atoms, nitrogen atoms, carbon atoms and oxygen atoms. This is because an increase in the concentration of carbon atoms in the surface of the film causes a decrease in the gas-barrier property.

Fluorine-Free Hydrophobic Resin;

In the present invention, the hydrophobic resin used as the film-forming component together with the polysilazane is the one that has a water absorption of not more than 0.05% when left to stand in the atmosphere of 23° C. for 24 hours, but excludes those having high water absorptions such as acrylic resin, etc.

The hydrophobic resin that is used is of the fluorine-free type which does not contain fluorine and which does not react with the polysilazane, i.e., is a resin which contains neither the OH group nor the aliphatic unsaturated group.

Use of a fluorine-contained resin imposes limitation on the solvent and makes it impossible to prepare a coating solution in which the polysilazane is homogeneously dissolved. Further, if there is used a hydrophobic resin which reacts with the polysilazane, then the polysilazane is locked by the hydrophobic resin. As a result, there is not formed a structure of such a profile that the $SiO_2$ is locally distributed on the surface, and a high degree of gas-barrier property is not obtained.

As the hydrophobic resin as described above, there is used a resin of the fluorine-free type that does not react with the polysilazane. As the hydrophobic resin, there can be exemplified a variety of kinds of the resins. However, from the standpoint of advantageously and locally distributing, in the surface of the film, the SiO$_2$ formed by the reaction of the polysilazane with the water and firmly holding the SiO$_2$ locally distributed in the surface, there can be preferably used polyester resins such as polyethylene terephthalate and polyethylene naphthalate; low-density polyethylene, linear low-density polyethylene, intermediate- or high-density polyethylene, polypropylene, poly 1-butene, poly 4-methyl-1-pentene, random or block copolymers of α-olefins (e.g., ethylene, propylene, 1-butene, 1-pentene, 1-hexene, 1-octene, 3-methyl 1-pentene, 1-decene, etc.) and copolymers of α-olefin and cyclic olefin (hereinafter called cyclic olefin copolymers). Among them, cyclic olefin copolymers are most desired.

As the cyclic olefin in the cyclic olefin copolymer, there can be representatively used an aliphatic hydrocarbon compound (e.g., cyclohexene) having an ethylenically unsaturated bond and a bicyclo ring. However, there can also be used a bicycle ring having a bridging group (e.g., methylene group or ethylene group) in the cyclohexene ring, or an aliphatic hydrocarbon having a polycyclic structure in which an aliphatic ring is further bonded to the bicyclo ring.

The aliphatic hydrocarbon compound of the polycyclic structure can be represented by the following formula (3):

wherein Z is a methylene group or an ethylene group.

Described below are concrete examples of the aliphatic hydrocarbon compound having the polycyclic structure.

Bicyclo[2.2.1]
hepto-2-en

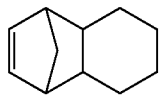

Tricyclo[4.4.0.1$^{2.5}$]-
3-undecene

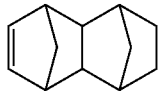

Tetracyclo
[4.4.0.1$^{2.5}$.1$^{7.10}$]-
3-dodecene

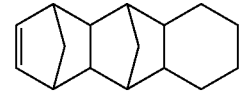

Pentacyclo[6.6.1.1$^{3.6}$.0$^{2.7}$.0$^{9.14}$]-
4-hexadecene

-continued

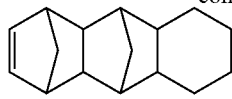

Pentacyclo[6.6.1.1$^{3.6}$.0$^{2.7}$.0$^{9.14}$]-
4-hexadecene

The cyclic olefins are not limited to those described above, as a matter of course, but may be those having 1 or 2 or more substituents such as alkyl groups in the aliphatic ring in the formula (3), or may be those exemplified in the Japanese Patent No. 3893650.

In the invention, the hydrophobic resin should have a molecular weight large enough for forming a film and is, usually, used in an amount of 40 to 95 parts by weight, specifically, 60 to 90 parts by weight per 100 parts by weight of the coating composition. If the amount of the hydrophobic resin is too large, the SiO$_2$ formed by the reaction of the polysilazane with the water cannot be locally made present in sufficient amounts in the surface of the film and causes a decrease in the gas-barrier property. If the amount of the hydrophobic resin is too small, on the other hand, the SiO$_2$ is made locally present in excess amounts in the surface. This permits the surface to be easily cracked and the SiO$_2$ made locally present in the surface to be easily peeled off.
Other Components;

The polysilazane coating composition is prepared by mixing the polysilazane and the hydrophobic resin into a volatile organic solvent. As the organic solvent, there is used the one that does not prevent in the surface the localized presence of the SiO$_2$ formed from the polysilazane. Concretely, there is used the organic solvent that does not react with the polysilazane and that is hydrophobic.

The organic solvents that can be favorably used include aliphatic hydrocarbon type solvents, such as n-octane, n-nonane, cyclohexane, ethylcyclohexane and decalin; and aromatic hydrocarbon type solvents, such as benzene, xylene and toluene.

The organic solvent should be used in such an amount that the coating composition that is finally obtained acquires a viscosity suited for being applied.

The polysilazane coating composition can, further, be blended with various kinds of additives known per se. in the field of coating materials, such as pigment, antioxidant, leveling agent, defoaming agent and antistatic agent so far as they do not prevent in the surface the localized presence of the SiO$_2$ formed from the polysilazane and do not cause a decrease in the gas-barrier property.
Inorganic Barrier Film (Third Inorganic Barrier Layer);

The above-mentioned polysilazane coating composition is applied on the surface of a predetermined base material (e.g., underlying organic layer or auxiliary water-trapping layer) and is then heated to remove the organic solvent, whereby a film of the coating composition is formed. Thereafter, by the irradiation with light (e.g., irradiation with ultraviolet ray of a wavelength of not longer than 200 nm in vacuum), by the heating, or by the treatment with a plasma, the polysilazane in the coating composition is cured to form SiO$_2$ to thereby form an inorganic barrier film (organic/inorganic cured film) that serves as the third inorganic barrier layer.

The thus formed inorganic barrier film effectively prevents the occurrence of cracks, adheres excellently to the underlying organic layer or the auxiliary water-trapping layer, stably holds the SiO$_2$ that is locally present in the surface thereof without permitting it to peel off, and exhibits excellent gas-barrier property.

Upon adjusting the quantity ratio of the polysilazane and the hydrophobic resin to lie within the above-mentioned range, the inorganic barrier film acquires a concentration of carbon atoms of 0.01 to 10 atomic % and, specifically, 0.01 to 5 atomic % on the basis of the four kinds of atoms of silicon atoms, nitrogen atoms, carbon atoms and oxygen atoms at a depth of 10 nm from the surface of the film as measured by the XPS. In this case, the $SiO_2$ is locally present in the surface to exhibit the gas-barrier property and the anti-cracking property in a well-balanced manner, which is most suited for the present invention.

If the concentration of carbon atoms is higher than the above range, the $SiO_2$ is made locally present in decreased amounts in the surface and the gas-barrier property tends to decrease.

Here, the concentration of carbon atoms is measured at the depth of 10 nm from the surface of the film to use it as an index for holding such properties as gas-barrier property, etc. This is because if the concentration is measured in a region shallower than the above point, then the measured value tends to be dispersed being affected by contamination.

Moreover, with the above inorganic barrier film, the concentration of silicon atoms tends to vary near the interface to the underlying base material (e.g., in a region within 50 nm from the interface to the underlying base material); i.e., the concentration of silicon atoms tends to increase gradually toward the interface to the underlying base material.

The thickness of the inorganic barrier material used as the third inorganic barrier layer can be suitably set depending on the viscosity and the like of the coating composition. For instance, the thickness can be increased if there is used the coating composition of a high viscosity. Usually, however, the thickness thereof may be set to be about 150 nm to about 3 μm.

The above inorganic barrier film adheres excellently to the underlying base material and is capable of imparting a high degree of gas-barrier property irrespective of if the underlying base material has a surface rich in organic property (e.g., organic layer or auxiliary water-trapping layer) or has a surface rich in inorganic property (e.g., second inorganic barrier layer).

In the water-barrier laminate of the present invention, the organic layer 9 can be provided as an underlying layer for the second inorganic barrier layer or the third inorganic barrier layer. To impart a function other than that of the underlying layer, there can be further provided an organic layer having a large thickness so as to exhibit a water-diffusing function (hereinafter often called water-diffusing organic layer).

For instance, a water-diffusing layer can be provided between the first inorganic barrier layer 3 and the water-trapping layer 5.

Figure 32A:
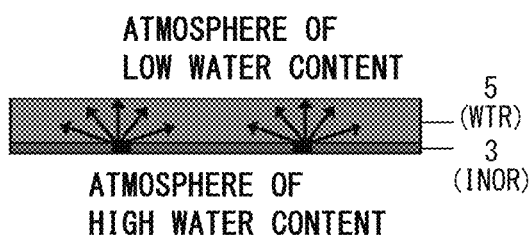
FIGS. 32A and 32B are diagrams illustrating the function of a water diffusing organic layer.
Figure 32B:
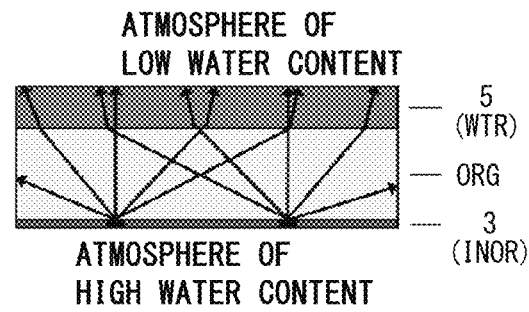

Function of the Water-Diffusing Organic Layer;

Reference should be made to FIGS. 32A and 32B which illustrate the function of the organic layer.

In FIG. 32A, for instance, the water-trapping layer 5 is provided directly on the first inorganic barrier layer 3 that faces the high water-content atmosphere side (outer surface side), and the water flows from the inorganic barrier layer 3 into the water-trapping layer 5 as indicated by arrows.

Here, the inorganic barrier layer is an inorganic vapor-deposited film formed by the physical deposition or the chemical deposition, and comprises various metals or metal oxides that exhibit a high degree of barrier property against the water, but unavoidably contains fine defects such as pinholes or cracks. These defects are designated at X in the drawing.

In FIG. 32A, therefore, the water flows in large amounts into the water-trapping layer 5 through the defects X. In the water-trapping layer 5, therefore, the portions facing the defects x are saturated quicker than the other portions, and the water-barrier property is deteriorated. In other words, the water-barrier property may last high but in short periods of time, and decreases conspicuously after the passage of, for example, one day or more.

Referring to FIG. 32B, on the other hand, the organic layer 9 of a large thickness is provided between the inorganic barrier layer 3 and the water-trapping layer 5. In this case, the water flows into the organic layer 9 through the defects X in the inorganic barrier layer 3 and, further, flows into the water-trapping layer 5. In this case, since the organic layer 9 has a suitably large thickness, the water that has flown into the organic layer 9 through the defects X is diffused in the organic layer 9. As a result, the water flows into the water-trapping layer 5 after having once diffused in the direction of surface of the organic layer 9. As shown in FIG. 32B, therefore, there occurs no such an inconvenience that the water flows into the water-trapping layer 5 in a locally concentrated manner. Therefore, the water-trapping layer 5 is allowed to exhibit the water-trapping property maintaining stability over extended periods of time.

The effect of maintaining the improved stability over extended periods of time is effective particularly when the inorganic barrier layer 3 has a high degree of barrier property. For example, when the inorganic barrier layer 3 has a water vapor permeability of $10^{-3}$ to $10^{-4}$ g/m²/day, the number of defects X is very small, and the permeation of water vapor is concentrated very locally. If the organic layer 9 of a large thickness is not provided between the inorganic barrier layer 3 and the water-trapping layer 5, the water that has passed through the defects X of the inorganic barrier layer 3 then flows into the water-trapping layer 5 in a very locally concentrated manner. That is, the water-trapping layer 5 contributes only partly to absorbing the moisture but does not in most part contribute to absorbing the moisture. Therefore, the water-barrier property deteriorates more quickly. Upon providing the organic layer 9 of a suitable thickness between the inorganic barrier layer 3 and the water-trapping layer 5, on the other hand, the water permeates into the whole water-trapping layer 5 as shown in FIG. 32B. Therefore, the water-trapping layer 5 is not locally deteriorated but shuts off the water over the whole surface thereof. Thus, the water-trapping layer 5 works to exhibit its excellent water-barrier property maintaining stability over extended periods of time.

The organic layer 9 having the water-diffusing function can basically be formed by using any thermoplastic resin or thermosetting resin having property that permits moisture to permeate through more than the water-trapping layer 5 or the inorganic barrier layer 3. Its thickness, however, must be not less than 10 μm and, specifically, not less than 20 μm. Moreover, it is desired that its thickness is not less than three times the thickness of the water-trapping layer 5.

If, for example, the thickness of the organic layer 9 is smaller than the above range, the water that has flown in through the defects X then flows into the water-trapping layer 5 permeating through the organic layer 9 without almost being diffused therein in the direction of surface thereof. As a result, the ability becomes low for preventing the water-trapping layer 5 from being locally deteriorated. That is, in case a thin layer such as an adhesive resin layer is formed on the inorganic barrier layer 3 and, besides, the water-trapping layer 5 is formed thereon via the adhesive resin layer, then the water is not diffused sufficiently in the adhesive resin layer and hence the water-trapping layer 5 is subject to be locally deteriorated.

The water-diffusing organic layer 9 may be made of the same material as the above-mentioned plastic base material 1 but may also be formed in a plurality of layers under a condition that the total thickness thereof is not less than 10 µm and, specifically, not less than 20 µm. For instance, to maintain a close adhesion to the inorganic barrier layer 3, the organic layer 9 can be formed in a multilayered structure, and the layer on the side interfacing the inorganic barrier layer 3 can be formed by using an adhesive resin such as acid-modified olefin resin. Moreover, the organic layer 9 may include an oxygen-barrier layer formed by using a gas-barrier resin such as ethylene•vinyl alcohol copolymer.

It is, further, desired that the water-diffusing organic layer 9 permits the water to permeate through little, and has a water vapor permeation coefficient of, for example, not more than 2.0 g·mm/m$^2$·day/atm and, specifically, not more than 0.5 g·mm/m$^2$·day/atm. Namely, the less the organic layer 9 permits the water to permeate through, the more the organic layer 9 has a function for diffusing, in the direction of surface thereof, the water (vapor) that has flown in through the defects X of the inorganic barrier layer 3. It is, therefore, allowed to effectively suppress the water-trapping layer 5 from being locally deteriorated without the need of excessively increasing the thickness of the organic layer 9.

In the invention, it is most desired that the water-diffusing organic layer 9 is formed by using a polyester resin as represented by polyethylene terephthalate (PET) or by using an olefin resin as represented by polyethylene or polypropylene.

Referring to FIG. 1, the organic layer 9 is provided on the inner surface side of the second inorganic barrier layer 7 neighboring thereto, and works as the underlying layer for the second inorganic barrier layer 7. It is here allowable to increase the thickness of the organic layer 9 so as to possess the water-diffusing function. It is thus made possible to suppress the auxiliary water-trapping layer 10 from being deteriorated by the defects of the second inorganic barrier layer 7.

In the water barrier laminate 11 of the present invention, further, a variety of kinds of layers may be laminated between, for example, the first inorganic barrier layer 3 and the water-trapping layer 5. Between them, for example, one or two or more inorganic barrier layers may, further, be laminated via a suitable organic layer, or the inorganic barrier layer and the water-trapping layer may be laminated one upon the other. Such a multilayered structure enables the water-barrier property to be further improved. Further, when the water-trapping layer and the inorganic barrier layer are formed each in a plurality of numbers, it is desired to form the organic layer 9 having the large thickness and the water-diffusing function between each trapping layer and the inorganic barrier layer located on the side of the high water content atmosphere from the standpoint of exhibiting the property of the water-trapping layer to a maximum degree.

Described below are examples of the structures of layers that can be employed for the water barrier laminate 11 of the present invention.

The plastic base materials are denoted by PLA, the water-trapping layers by WTR, the auxiliary water-trapping layers by AS-WTR, the inorganic barrier layers by INOR, and the organic layers are denoted by ORG.

In these constitutions of layers, the inorganic barrier layers that are formed without forming the underlying organic layers (ORG) are those formed by the coating method.

Further, the left side is the outer surface side and the right side is the inner surface side.

<Outside→Inside>

PLA/INOR/WTR/INOR/ORG/AS-WTR
PLA/INOR/WTR/INOR/ORG/AS-WTR/INOR
PLA/INOR/WTR/INOR/ORG/AS-WTR/ORG
PLA/INOR/WTR/INOR/ORG/AS-WTR/ORG/INOR
PLA/INOR/WTR/INOR/ORG/INOR/AS-WTR
PLA/INOR/WTR/INOR/ORG/INOR/AS-WTR/INOR
PLA/INOR/WTR/INOR/ORG/INOR/AS-WTR/ORG
PLA/INOR/WTR/INOR/ORG/INOR/AS-WTR/ORG/INOR
PLA/INOR/ORG/WTR/INOR/ORG/INOR/AS-WTR
PLA/INOR/ORG/WTR/INOR/ORG/INOR/AS-WTR/INOR
PLA/INOR/ORG/WTR/INOR/ORG/INOR/AS-WTR/ORG
PLA/INOR/ORG/WTR/INOR/ORG/INOR/AS-WTR/ORG/INOR
PLA/INOR/ORG/WTR/INOR/ORG/ORG/AS-WTR
PLA/INOR/ORG/WTR/INOR/ORG/ORG/AS-WTR/INOR
PLA/INOR/ORG/WTR/INOR/ORG/ORG/AS-WTR/ORG
PLA/INOR/ORG/WTR/INOR/ORG/ORG/AS-WTR/ORG/INOR
PLA/INOR/ORG/WTR/INOR/ORG/INOR/ORG/AS-WTR
PLA/INOR/ORG/WTR/INOR/ORG/INOR/ORG/AS-WTR/INOR
PLA/INOR/ORG/WTR/INOR/ORG/INOR/ORG/AS-WTR/ORG
PLA/INOR/ORG/WTR/INOR/ORG/INOR/ORG/AS-WTR/ORG/INOR
PLA/INOR/ORG/WTR/INOR/ORG/ORG/INOR/ORG/AS-WTR
PLA/INOR/ORG/WTR/(INOR/ORG)×2/ORG/AS-WTR
PLA/INOR/ORG/WTR/(ORG/INOR)×2/ORG/AS-WTR
PLA/INOR/ORG/WTR/(INOR/ORG)×4/ORG/AS-WTR
(PLA/INOR)×4/ORG/WTR/INOR/ORG/ORG/AS-WTR
PLA/INOR/(ORG/WTR)×2/INOR/ORG/ORG/AS-WTR
(PLA/INOR)×4/(ORG/WTR)×2/INOR/ORG/ORG/AS-WTR
PLA/INOR/ORG/WTR/INOR/ORG/ORG/WTR/ORG/INOR/AS-WTR
PLA/INOR/ORG/WTR/INOR/ORG/ORG/WTR/ORG/INOR/AS-WTR/ORG
PLA/INOR/WTR/INOR/ORG/ORG/INOR/AS-WTR
PLA/INOR/WTR/INOR/ORG/ORG/INOR/AS-WTR/ORG
PLA/INOR/WTR/INOR/ORG/ORG/INOR/AS-WTR/ORG/INOR
PLA/INOR/WTR/INOR/ORG/ORG/INOR/AS-WTR/INOR
PLA/INOR/WTR/INOR/ORG/ORG/INOR/WTR/ORG/INOR/AS-WTR
PLA/INOR/WTR/INOR/ORG/ORG/INOR/WTR/ORG/INOR/AS-WTR/ORG
PLA/INOR/WTR/INOR/ORG/ORG/INOR/WTR/WTR/INOR/ORG/ORG/INOR/AS-WTR
PLA/INOR/WTR/INOR/ORG/INOR/ORG/ORG/INOR/ORG/INOR/AS-WTR

PLA/INOR/(WTR/INOR/ORG/INOR/ORG)×2/ORG/
   INOR/ORG/INOR/AS-WTR
PLA/INOR/(WTR/INOR/ORG/INOR/ORG)×2/ORG/
   INOR/ORG/INOR/AS-WTR/ORG/INOR

The water barrier laminate 11 of the present invention can be produced by any laminating method known per se. depending on the constitution of the layers. For instance, when a neighboring layer is to be laminated by using the dry-lamination method, the layer to be neighbored is laminated by using an adhesive for dry lamination, such as urethane adhesive or epoxy adhesive. For instance, an organic layer such as PET film may be formed on the first inorganic barrier layer 3 that is formed on the plastic base material 1. In this case, the organic layer and the first inorganic barrier layer 3 can be laminated being adhered together by using an adhesive for dry lamination. Namely, an adhesive layer is made present between the first inorganic barrier layer 3 and the organic layer. The adhesive layer, however, has not been shown in FIG. 1 or in the examples of the structures of the layers.

The adhesive layer has a thickness which is, usually, not more than 10 μm.

With the above-mentioned water barrier laminate 11, even if the inner surface side of the water-trapping layer 5 is formed in a considerably large thickness, in order to effectively suppress the flow of water from the side surfaces (end surfaces) thereof, in this portion, therefore, there can be formed an organic layer or an inorganic barrier layer having a high degree of barrier property to realize the water barrier laminate 11 in a multilayered structure, bringing about an increase in the degree of freedom for designing the layers, which is a great advantage.

<Use>

The above water barrier laminate 11 of the present invention can be favorably used as a film for sealing a variety of kinds of electronic devices such as organic EL devices, solar cells, as well as electronic circuits such as e-papers. Namely, the water barrier laminate 11 is fitted to various kinds of devices in a manner that the plastic base material 1 is on the side of the high-humidity atmosphere (concretely, on the side of the atmosphere) and the auxiliary water-trapping layer 10 is on the side of the low-humidity atmosphere (concretely, on the side of the device) to exhibit its excellent water-barrier property and to effectively prevent the leakage of electric charge caused by the water. The water barrier laminate 11 of the invention can be used, for example, for the protection of or light-emitting devices in the organic EL and photovoltaic power generating devices in the solar cells.

EXAMPLES

Excellent properties of the gas-barrier laminate of the invention will now be described by way of Experimental Examples.

FIGS. 3 to 30 illustrate the structures of layers of laminates prepared in Examples and Comparative Examples. In these drawings, PLA denotes the plastic base material, INOR denotes the inorganic barrier layer formed by vacuum evaporation, INOR-COAT denotes the inorganic barrier film formed by the coating method, WTR denotes the water-trapping layer, AS-WTR denotes the auxiliary water-trapping layer, and ORG denotes the organic layer. Further, the film having an inorganic barrier layer formed on the PET film is denoted by GB.

<Measuring the Water Vapor Permeability (g/m²/Day)>

In compliance with the method described in JP-A-2010-286285, measurement was taken as describe below.

By using a vacuum evaporation apparatus (JEE-400 manufactured by JEOL Ltd.), a thin Ca film (water-corrosive thin metal layer) was formed by vacuum evaporation in a thickness of 300 nm on the surface of a sample water barrier laminate on the side of the low-humidity atmosphere. Further, an Al film (water-impermeable thin metal layer) was vapor-deposited in a thickness of 540 nm so as to cover the thin Ca film to thereby prepare a sample piece.

Here, the thin Ca film was vapor-deposited in a square shape of a side of 1 cm on two places by using metal calcium as a source of vacuum evaporation and by using a predetermined mask. Thereafter, the mask was taken away in a vacuum state, and Al was vapor-deposited thereon from an Al vacuum evaporation source in the apparatus.

The thus formed sample was placed in a gas-impermeable cup filled with the activation-treated silica gel (moisture absorbing capability of 300 mg/g) as the moisture-absorbing agent, and was fixed therein by using a fixing ring to prepare a unit for evaluation.

The thus prepared unit for evaluation was held in an air-conditioned vessel adjusted to an atmosphere of 40° C. 90% for 1000 hours. Thereafter, by using a laser microscope (laser scan microscope manufactured by Carl Zeiss Co.), the thin Ca film of the sample was observed for its state of corrosion, and the water vapor permeability was calculated from the amount of the metal calcium that was corroded. The evaluation was conducted on the following basis.

⊚: The water vapor permeability was not more than $10^{-5}$ g/m²/day.

◯: The water vapor permeability was more than $10^{-5}$ g/m²/day but was less than $10^{-3}$ g/m²/day.

X: The water vapor permeability was not less than $10^3$ g/m²/day.

<Confirming the Water Permeated Through the End Surfaces (Side Surfaces)>

A Ca film and an Al film were vapor-deposited on the sample water barrier laminate in the same manner as described above to prepare a sample piece. From a progress of corrosion that might start from the edge of the thin Ca film, the sample piece was then evaluated for the effect (water-barrier property on side surfaces) of the water that has permeated through the end surfaces (side surfaces) of the laminate. The evaluation was conducted on the following basis.

◯: No corrosion was seen to have started from the edges within 1000 hours in an environment of an atmosphere of 40° C. 90%.

X: Corrosion was observed to have started from the edges within 1000 hours.

<Desiccating Effect>

By using the vacuum evaporation apparatus (JEE-400 manufactured by JEOL Ltd.), a thin Ca film (water-corrosive thin metal layer) was formed by vacuum evaporation in a thickness of 300 nm on a glass plate (3 cm×3 cm, thickness: 0.5 mm) to prepare a test piece which was then transferred into a gloved box so will not be exposed to the atmosphere.

Here, the thin Ca film was vapor-deposited in a square shape of a side of 1 cm on one place by using metal calcium as a source of vacuum evaporation and by using a predetermined mask.

In the gloved box, a UV-curing type sealing resin (XNR5516Z-B1 produced by Nagase ChemteX Corporation) was applied onto the test piece prepared as described above in a manner that the width after having been sealed was 2 mm, and was stuck to the surface of the water barrier laminate on the side of the low-humidity atmosphere followed by a UV-curing treatment (cumulative light quantity:

6 J/cm²) and a heat-curing treatment (80° C. for 1 hour). Further, to prevent the flow-in of water from the direction of thickness, too, the glass plate (3 cm×3 cm, thickness: 0.5 mm) was also stuck to the surface of the water barrier laminate on the side of the high-humidity atmosphere to prepare a unit for evaluation.

The thus prepared unit for evaluation was held in the air-conditioned vessel adjusted to an atmosphere of 40° C. 90% for 1000 hours. Thereafter, by using the laser microscope (laser scan microscope manufactured by Carl Zeiss Co.), the thin Ca film of the sample was observed for its state of corrosion, and the desiccating effect was evaluated on the following basis.
- ○: No corrosion was seen on the thin Ca film (desiccating effect exhibited).
- X: Corrosion was seen on the thin Ca film (desiccating effect was not exhibited).

<Preparation of the INOR-Coated PET Film>

By using a plasma CVD apparatus, an inorganic barrier layer of silicon oxide was formed on one surface of a biaxially stretched polyethylene terephthalate (PET) film of a thickness of 12 μm. Described below were the conditions for forming the films.

There was used a CVD apparatus equipped with a high-frequency power source of a frequency of 27.12 MHz and a maximum output of 2 kW, a matching box, a metallic cylindrical plasma-treating chamber of a diameter of 300 mm and a height of 450 mm, and a hydraulic rotary vacuum pump for evacuating the treating chamber.

A plastic base member was placed on flat parallel plates in the treating chamber, a hexamethyldisiloxane was introduced at a rate of 3 sccm, oxygen was introduced at a rate of 45 sccm, and a 50-watt high-frequency output was generated by the high-frequency oscillator for 2 seconds to form a film to thereby form a closely adhered layer. Next, a 200-watt high-frequency output was generated by the high-frequency oscillator for 20 seconds to form an inorganic barrier layer of silicon oxide to thereby obtain an INOR-coated PET film X1. The obtained film X1 exhibited a water vapor permeability of $5×10^{-2}$ g/m²/day as measured in an atmosphere of 40° C. 90% RH.

Moreover, an inorganic barrier layer of the silicon oxide was formed on the PET surface of the above INOR-coated PET film X1 under the same conditions as those described above to prepare an INOR-coated PET film X2 with its both surfaces being coated with the inorganic barrier layer. The film X2 exhibited a water vapor permeability of $2×10^{-2}$ g/m²/day as measured in the atmosphere of 40° C. 90% RH.

Example 1

There was provided an aqueous solution of a polyallylamine as an ionic polymer.
Polyallylamine Aqueous Solution;
 PAA-15C, produced by Nittobo Medical Co.
 Solid component, 15%
As the moisture-absorbing agent, further, there was provided the following crosslinked product of Na polyacrylate.
Crosslinked Product of Na Polyacrylate;
 TAFTIC HU-820E (aqueous dispersion), produced by Toyobo Co.
 Solid component, 13%

The above aqueous solution of the polyallylamine was so diluted with the water that the solid component thereof was 5% by weight to thereby obtain a polymer solution.

Further, a solution of a crosslinking agent was prepared by dissolving a γ-glycidoxypropyltrimethoxysilane (crosslinking agent) in the water such that the amount thereof was 5% by weight.

Next, the polymer solution and the solution of the crosslinking agent were mixed together such that the amount of the γ-glycidoxypropyltrimethoxysilane was 15 parts by weight per 100 parts by weight of the polyallylamine. To the mixed solution was, further, added the crosslinked product of Na polyacrylate (moisture-absorbing agent) such that the amount thereof was 400 parts by weight per 100 parts by weight of the polyallylamine, and to which was, further, added the water such that the amount of the solid component was 5%. The mixture was stirred well to obtain a coating solution A for forming the water-trapping layer and the auxiliary water-trapping layer.

Next, there was provided a PET film (Cosmo-Shine A4300 produced by Toyobo Co.) having a thickness of 38 μm.

By using a bar coater, the above coating solution A was applied onto one surface of the above PET film.

The film applied with the coating solution was heat-treated in a box-type electric oven under the conditions of a peak temperature of 120° C. and a peak temperature-holding time of 10 seconds. There was formed a film A1 comprising the PET film on which a water-trapping layer (WRT) of a thickness of 4 μm has been formed.

Based on the same method, further, there was obtained another film A2 by forming a 3 μm-thick auxiliary water-trapping layer (AS-WRT) on one surface of the 38 μm-thick PET film.

Next, in the gloved box in which the nitrogen concentration has been adjusted to be not lower than 99.95%, the above INOR-coated PET film X1 was dry-laminated on both surfaces of the film A1 via a 3 μm-thick epoxy type adhesive layer in such a manner that the inorganic barrier layer (INOR) was on the inside, to thereby obtain a laminated film A.

Next, the PET surface of the above laminated film A on the side close to the water-trapping layer and the PET surface of the film A2 on the side opposite to the AS-WRT layer were dry laminated one upon the other via a 3 μm-thick epoxy type adhesive layer. The laminate was then subjected to the aging in vacuum at 50° C. for 3 days to so cure the adhesive layers as will not absorb the moisture. There was thus obtained a water barrier laminate (1) having a structure of layers shown in FIG. 3.

Example 2

Figure 3:
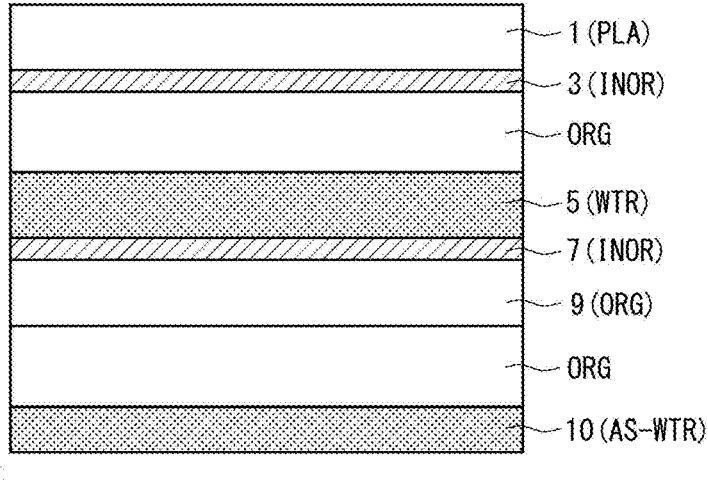
FIG. 3 is a schematic sectional view showing a structure of layers of water barrier laminates prepared in Examples 1 to 8.

A water barrier laminate (2) having the structure of layers shown in FIG. 3 was obtained in the same manner as in Example 1 but forming the AS-WTR layer in a thickness of 8 μm.

Example 3

An ion-exchange resin (Amberlite 200CT produced by Organo Co.) was provided.

By using the ion-exchange resin, the Na salt type carboxyl group of the crosslinked product (HU-820E) of the Na polyacrylate was transformed into the H-type carboxyl group. Thereafter, by using a 1N aqueous solution of potassium hydroxide, there was obtained a crosslinked product (aqueous dispersion, solid component of 10%, neutralization ratio of 80%) of the K polyacrylate having the potassium salt type carboxyl group.

A gas-barrier laminate (3) having the structure of layers shown in FIG. 3 was obtained in the same manner as in Example 1 but using the above crosslinked product of the K polyacrylate as the moisture-absorbing agent.

Example 4

As the ionic polymer (anionic polymer), a polyacrylic acid (AC-10LP produced by Nihon-Junyaku Co.) was partly neutralized by 80% with sodium hydroxide.

As the crosslinking agent, further, there was provided a diglycidyl 1,2-cyclohexanedicarboxylate.

Moreover, as the adhesive agent, there was provided a β-(3,4-epoxycyclohexyl) ethyltrimethoxysilane.

A water barrier laminate (4) having the structure of layers shown in FIG. 3 was obtained in the same manner as in Example 1 but using, as the ionic polymer, the above neutralized product of the polyacrylic acid, using, as the solvent, a water/acetone mixed solvent (weight ratio of 80/20), using the crosslinking agent in an amount of 15 parts by weight with respect to the partly neutralized product of the polyacrylic acid, using the above adhesive in an amount of 3 parts by weight with respect to the partly neutralized product of the polyacrylic acid, and using the moisture-absorbing agent in an amount of 420 parts by weight with respect to the partly neutralized product of the polyacrylic acid.

Example 5

A water barrier laminate (5) having the structure of layers shown in FIG. 3 was obtained in the same manner as in Example 1 but using a commercially available vapor-deposited PET film (Techbarrier Type HX produced by Mitsubishi Plastics, Inc.) formed by the PVD method instead of using the INOR-coated PET film X1.

Example 6

A water barrier laminate (6) having the structure of layers shown in FIG. 3 was obtained in the same manner as in Example 1 but using a commercially available vapor-deposited PET film (Techbarrier Type LS produced by Mitsubishi Plastics, Inc.) formed by the PVD method instead of using the INOR-coated PET film X1.

Example 7

A water barrier laminate (7) having the structure of layers shown in FIG. 3 was obtained in the same manner as in Example 1 but using a commercially available vapor-deposited PET film (GX-P-F produced by Toppan Printing Co., Ltd.) formed by the PVD method instead of using the INOR-coated PET film X1.

Example 8

A water barrier laminate (8) having the structure of layers shown in FIG. 3 was obtained in the same manner as in Example 1 but using a commercially available vapor-deposited PET film (GL-RD produced by Toppan Printing Co., Ltd.) formed by the PVD method instead of using the INOR-coated PET film X1.

Example 9

Figure 4:
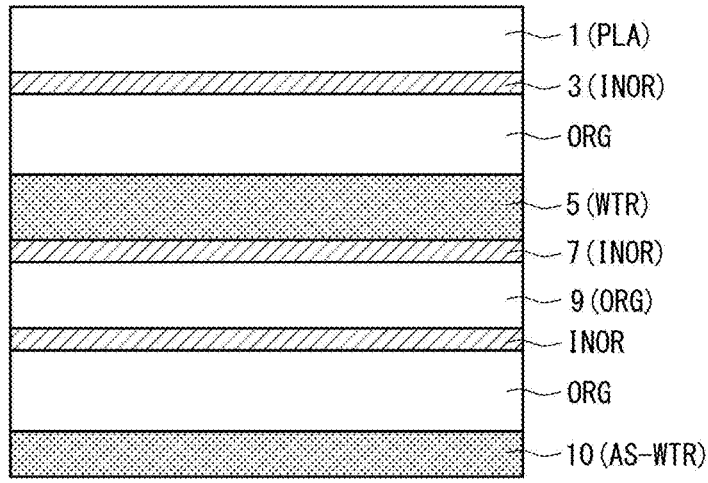
FIG. 4 is a schematic sectional view showing a structure of layers of a water barrier laminate prepared in Example 9.

A water barrier laminate (9) having a structure of layers shown in FIG. 4 was obtained in the same manner as in Example 1 but using INOR-coated PET film X2 instead of using the INOR-coated PET film X1 used on the side of the low-humidity atmosphere.

Example 10

Two pieces of the INOR-coated PET films X1 were dry-laminated one upon the other via a 3 μm-thick epoxy type adhesive agent in a manner that the INOR layers faced outwards to thereby obtain a two-layer-laminated film B with the INOR layers facing outward.

Figure 5:
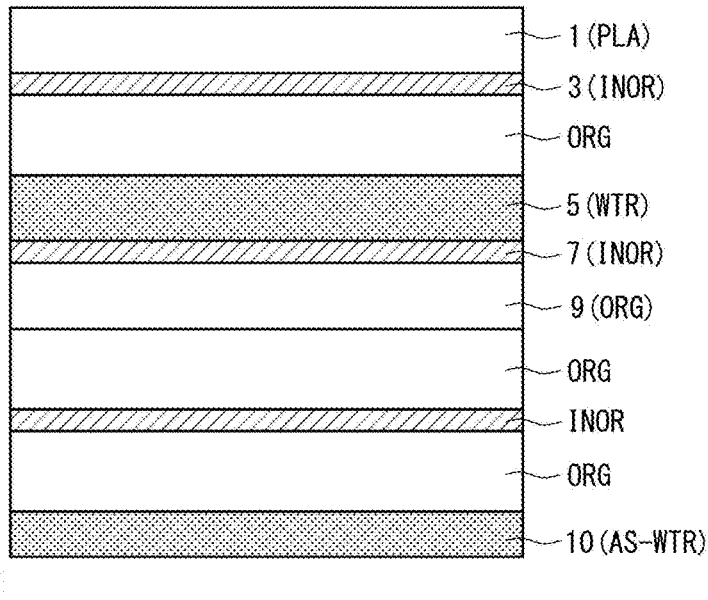
FIG. 5 is a schematic sectional view showing a structure of layers of a water barrier laminate prepared in Example 10.

A water barrier laminate (10) having a structure of layers shown in FIG. 5 was obtained in the same manner as in Example 9 but using the above laminated film B instead of using the INOR-coated PET film X2.

Example 11

Two pieces of the INOR-coated PET films X1 were dry-laminated one upon the other via a 3 μm-thick epoxy type adhesive agent in a manner that the INOR layer and the PET surface faced each other to thereby obtain a laminated film C having the INOR layer on one side and the PET surface on the other side.

Figure 6:
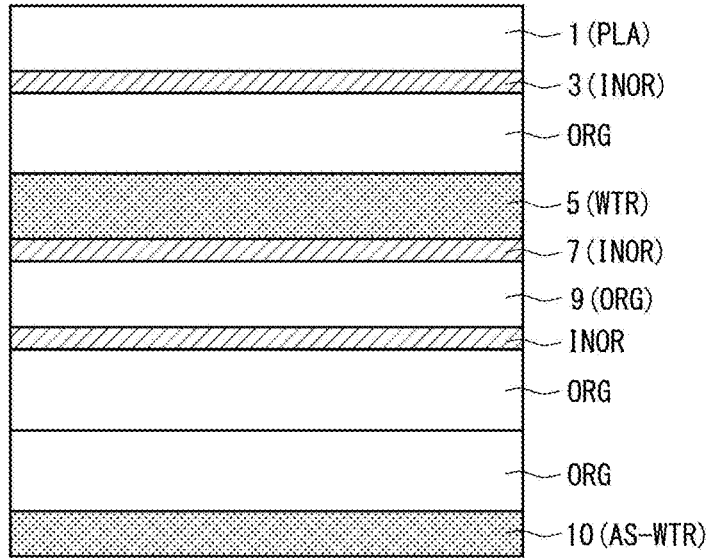
FIG. 6 is a schematic sectional view showing a structure of layers of a water barrier laminate prepared in Example 11.

A water barrier laminate (11) having a structure of layers shown in FIG. 6 was obtained in the same manner as in Example 9 but using the above laminated film C instead of using the INOR-coated PET film X2 and sticking the films together in such a manner that the water-trapping layer (WTR) and the INOR layer of the laminated film C faced each other.

Example 12

Figure 7:
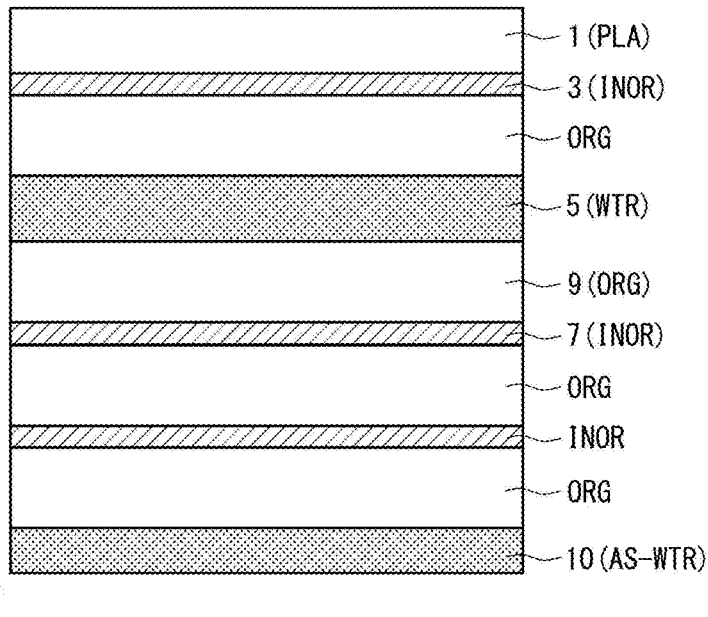
FIG. 7 is a schematic sectional view showing a structure of layers of a water barrier laminate prepared in Example 12.

A water barrier laminate (12) having a structure of layers shown in FIG. 7 was obtained in the same manner as in Example 11 but so sticking the films together that the water-trapping layer (WTR) and the PET surface of the laminated film C faced each other.

Example 13

Four pieces of the INOR-coated PET films X1 were dry-laminated one upon the other via a 3 μm-thick epoxy type adhesive agent in a manner that each INOR layer faced each PET surface to thereby obtain a laminated film D having the INOR layer on one side and the PET surface on the other side.

Figure 8:
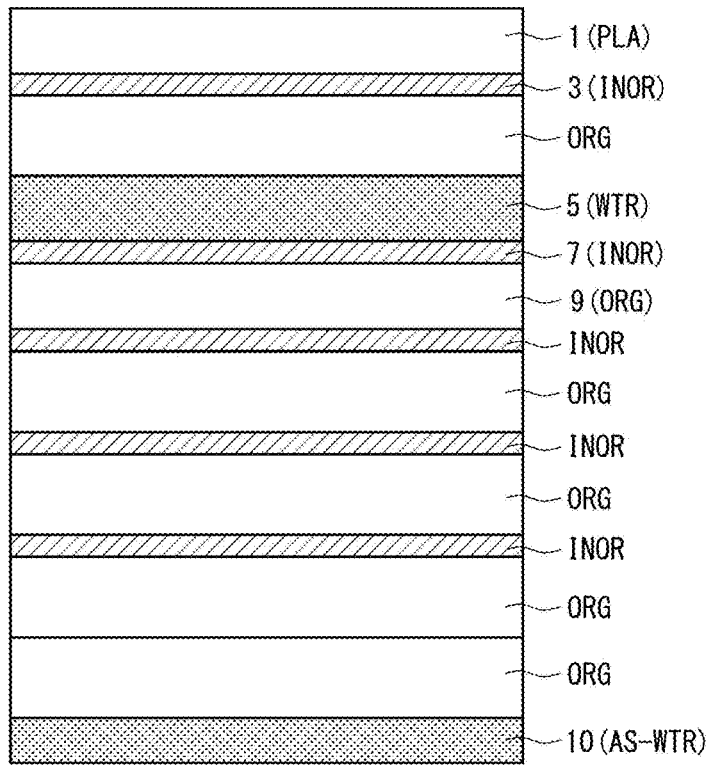
FIG. 8 is a schematic sectional view showing a structure of layers of a water barrier laminate prepared in Example 13.

A water barrier laminate (13) having a structure of layers shown in FIG. 8 was obtained in the same manner as in Example 11 but using the above laminated film D instead of using the laminated C.

Example 14

Figure 9:
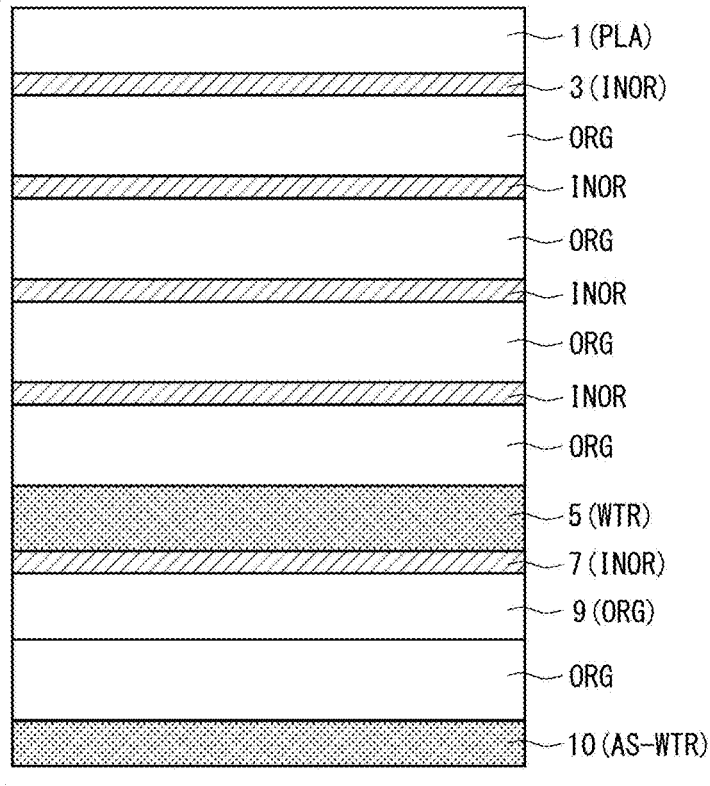
FIG. 9 is a schematic sectional view showing a structure of layers of a water barrier laminate prepared in Example 14.

A water barrier laminate (14) having a structure of layers shown in FIG. 9 was obtained in the same manner as in Example 1 but using the laminated film D described in Example 13 instead of using the INOR-coated PET film X1 that faced the high-humidity atmosphere side.

Example 15

Two pieces of the films Al were dry-laminated one upon the other via a 3 μm-thick epoxy type adhesive agent in a manner that the water-trapping layer (WTR) and the PET surface faced each other to thereby obtain a laminated film E having the water-trapping layer (WTR) on one side and the PET surface on the other side.

Figure 10:
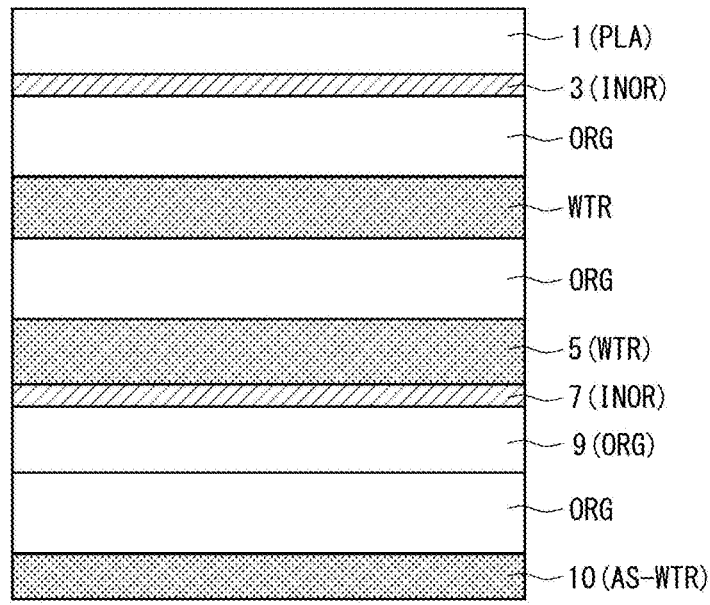
FIG. 10 is a schematic sectional view showing a structure of layers of a water barrier laminate prepared in Example 15.

A water barrier laminate (15) having a structure of layers shown in FIG. 10 was obtained in the same manner as in Example 1 but using the above laminated film E instead of using the film A1.

Example 16

Figure 11:
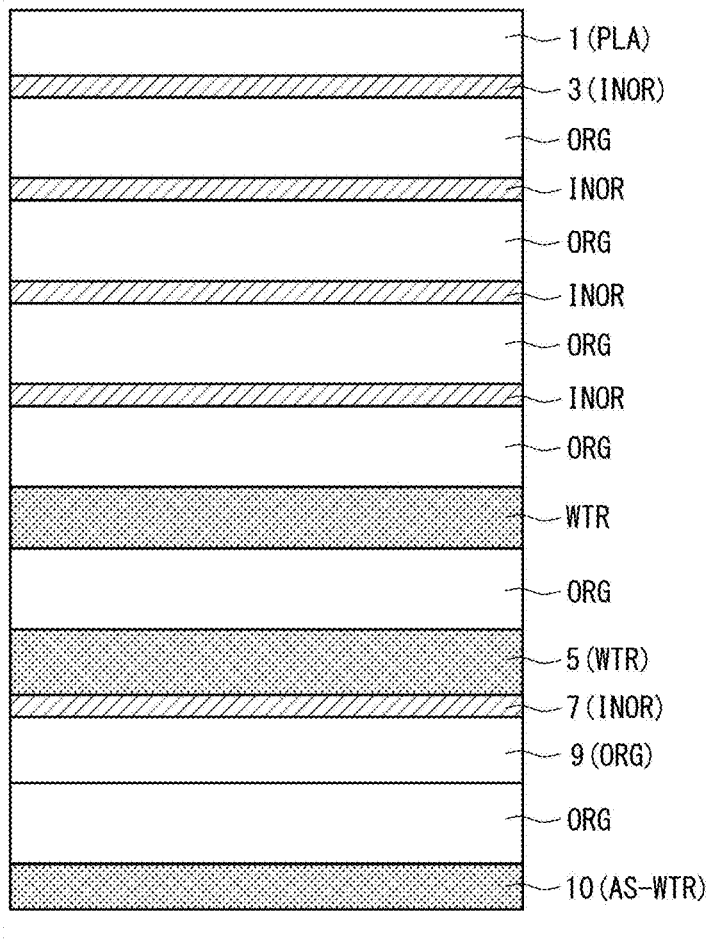
FIG. 11 is a schematic sectional view showing a structure of layers of a water barrier laminate prepared in Example 16.
Figure 12:
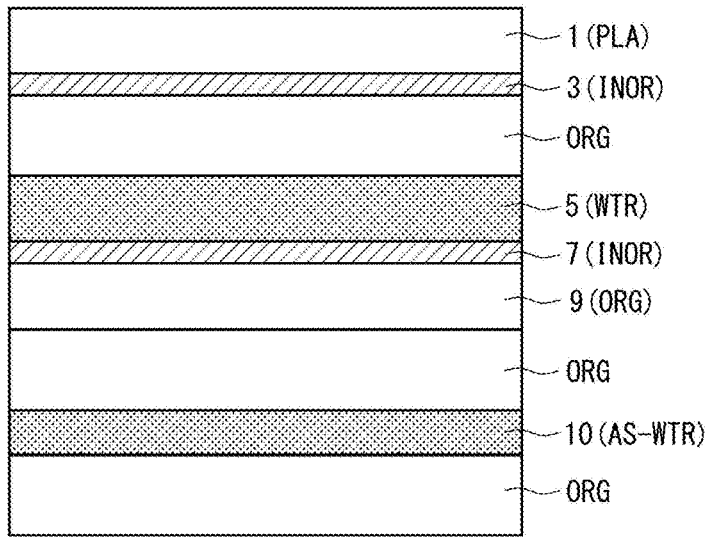
FIG. 12 is a schematic sectional view showing a structure of layers of a water barrier laminate prepared in Example 17.

A water barrier laminate (16) having a structure of layers shown in FIG. 11 was obtained in the same manner as in Example 14 but using the laminated film E described in Example 15 instead of using the film A1.

Example 17

The following polyester resin was provided.
Polyester resin; VYLON GK880, produced by Toyobo Co.

The polyester resin was dissolved in a 2-butanone to obtain a polymer solution containing a solid component in an amount of 10% by weight.

Next, an isocyanate compound (Coronate L, produced by Nihon Polyurethane Co.) was mixed into the polymer solution such that the amount thereof was 10 parts by weight relative to 100 parts by weight of the polyester resin. The 2-butanone was further added thereto with good stirring to prepare a coating solution F containing a solid component in an amount of 5% by weight.

By using a bar coater, the coating solution F was applied onto the AS-WTR layer of the water-barrier laminate (1) prepared in Example 1. The laminate after having been applied was heat-treated in a box type electric oven under the conditions of a peak temperature of 120° C. for a peak temperature-holding time of 10 seconds, whereby an organic layer (ORG) was formed in thickness of 4 μm, and a water-barrier laminate (17) of a structure of layers shown in FIG. 12 was obtained.

Example 18

By using a plasma CVD apparatus, an inorganic barrier layer of silicon oxide was formed on the ORG layer of the water-barrier laminate (17) described in Example 17 under the conditions described below, and there was obtained a water barrier laminate (18) of a structure of layers shown in FIG. 13.

There was provided the CVD apparatus that was also used for forming the INOR-coated PET films.

A plastic base member was placed on flat parallel plates in the treating chamber of the CVD apparatus, hexamethyldisiloxane was introduced at a rate of 3 sccm, oxygen was introduced at a rate of 45 sccm, and a 50-watt high-frequency output was generated by the high-frequency oscillator for 2 seconds to form a film to thereby form a closely adhered layer. Next, a 100-watt high-frequency output was generated by the high-frequency oscillator for 50 seconds to form an INOR film that possessed a water vapor permeability of 1 to $2 \times 10^{-1}$ g/m²/day as measured in an atmosphere of 40° C. 90% RH.

Example 19

The following cyclic olefin copolymer COC was provided.
COC; TOPAS 8007 produced by Polyplastics Co.

The COC was dissolved in a xylene to prepare a polymer solution containing a solid component in an amount of 20% by weight.

Moreover, the following perhydropolysilazane solution was provided.
Perhydropolysilazane solution; trade name, Aquamica NL110A-20 (xylene solution) produced by Merk Performance Materials Joint Co.

The above perhydropolysilazane solution (5% by weight) and the COC polymer solution (95% by weight) were mixed together. Next, xylene was added thereto with good stirring to prepare a coating solution G containing 10% by weight of a solid component (film-forming component: polysilazane).

By using the bar coater, the coating solution G was applied onto the AS-WTR layer of the water-barrier laminate (1) prepared in Example 1. The laminate after having been applied was heat-treated in the box type electric oven under the conditions of a peak temperature of 150° C. for a peak temperature-holding time of 3 minutes, whereby a film G was formed in a thickness of 1 μm on the AS-WTR layer.

Next, by using an excimer irradiation apparatus (MEIRA-M-1-152-H2 manufactured by M.D. Excimer Co.), the film G was cured under the following conditions to form an inorganic barrier layer (INOR-COAT) of the polysilazane type to thereby obtain a water barrier laminate (19) of a structure of layers shown in FIG. 14.

(Curing Conditions)
Luminous intensity: 60 mW/cm² (172 nm)
Stage-heating temperature: 80° C.
Irradiation distance: 3 mm
Conveying speed: 1 m/min
Frequency of conveyance: 10 times (5 round trips)
Oxygen concentration: 0%

Example 20

To 230 parts by weight of distilled water heated at 70° C., there was added dropwise 88 parts by weight of an aluminum isopropoxide with stirring over a period of one hour. The temperature of the liquid was gradually elevated up to 95° C. while letting the generated isopropanol to distill off to thereby carry out the hydrolytic condensation. To the thus obtained liquid, there was added 4.0 parts by weight of an aqueous solution containing 60% by weight of nitric acid. The mixture was stirred at 95° C. for 3 hours to peptize the aggregate of particles of the hydrolyzed condensate. The solution was then condensed such that the concentration of the solid component was 10% by weight calculated as alumina.

To 18.66 parts by weight of the thus obtained Al-containing solution, there were added 58.19 parts by weight of distilled water, 19.00 parts by weight of methanol and 0.50 parts by weight of an aqueous solution containing 5% by weight of polyvinyl alcohol. The mixture was stirred so as to become homogenized, and a dispersion solution h was thus obtained.

Next, to a dispersion solution h maintained at a liquid temperature of 15° C., there was added dropwise and with stirring 3.66 parts by weight of an aqueous solution that was similarly adjusted to be 15° C. and that contained 85% by weight of phosphoric acid to obtain a coating liquid D. The thus obtained coating liquid D was stirred continuously while maintaining the liquid temperature at 15° C. until the viscosity reached 1500 mPa·s.

First, a round bottom flask (capacity: 50 ml) equipped with a stirrer, a refluxing cooler, a dropping funnel and a thermometer was purged with nitrogen. Thereafter, 12 g of a 2-butanone was fed thereto, and the flask was dipped in an oil bath and was heated at 80° C. to start the refluxing. From this moment, a nitrogen gas was continued to be flown in a very small amount throughout the whole step of polymerization.

Next, there was prepared a mixed solution of 8.5 g of an acid phosphoxyethyl methacrylate, 5 g of a 2-butanone and 0.1 g of an azobisisobutylonitrile. The mixed solution was added dropwise into the flask into which the 2-butanone has been fed, the dropwise addition being conducted at a constant rate through the dropping funnel over a period of 10 minutes. The temperature was maintained at 80° C. even after the dropwise addition has been finished, and the solution was continuously stirred for about 12 hours to obtain a solution of a viscous liquid polymer (polyethyl methacrylate) of yellowish color.

The above polymer solution was poured into a 1,2-dichloroethane of an amount of about 10 times as much, the supernatant liquid was removed by decantation, the precipitate was recovered, and the polymer was isolated. The recovered polymer was dissolved in a tetrahydrofuran which is a good solvent for the polymer, and was precipitated again in the 1,2-dichloroethane of an amount of about 10 times as much. This operation was repeated three times to refine the polymer. The refined polymer was dissolved in a solvent of THF to a polymer concentration of 1% by weight and was measured for its molecular weight based on the gel permeation chromatography. The molecular weight of the polymer was about 10,000 calculated as the polystyrene.

The refined polymer (polyethyl methacrylate) was dissolved in a mixed solvent of water and isopropanol to a concentration of 10% by weight to obtain a coating solution I.

By using the bar coater, the coating solution D was applied onto the AS-WTR layer of the water-barrier laminate (1) prepared in Example 1. The laminate after having been applied was heat-treated in the box type electric oven under the conditions of a peak temperature of 110° C. for a peak temperature-holding time of 5 minutes and, thereafter, under the conditions of a peak temperature of 180° C. for a peak temperature-holding time of 1 minute, whereby a film H was formed in a thickness of 0.5 μm on the AS-WTR layer.

Next, the coating solution I was applied onto the above film H by using the bar coater. The coating solution I was then heat-treated in the box type electric oven under the conditions of a peak temperature of 110° C. for a peak temperature-holding time of 5 minutes, whereby a film I was formed in a thickness of 0.3 μm, and there was obtained a water-barrier laminate (20) of a structure of layers shown in FIG. 14 having an alumina type inorganic barrier layer (INOR-COAT).

Example 21

Figure 13:
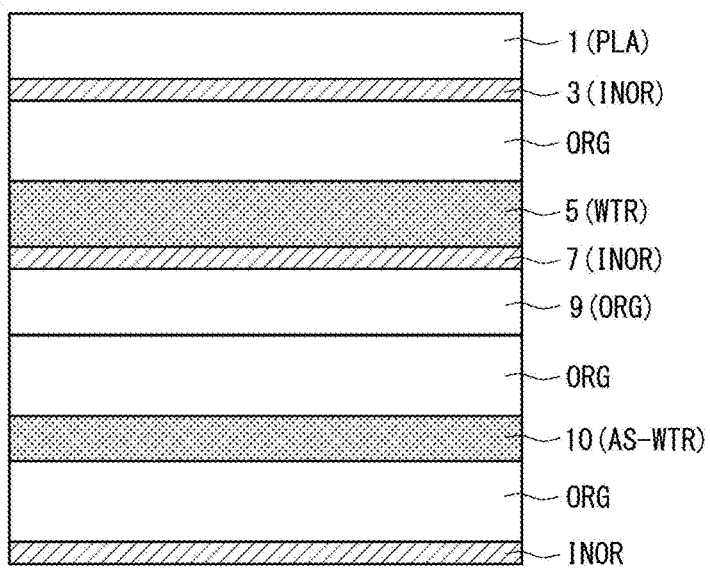
FIG. 13 is a schematic sectional view showing a structure of layers of water barrier laminates prepared in Examples 18, 21 and Comparative Example 4.
Figure 14:
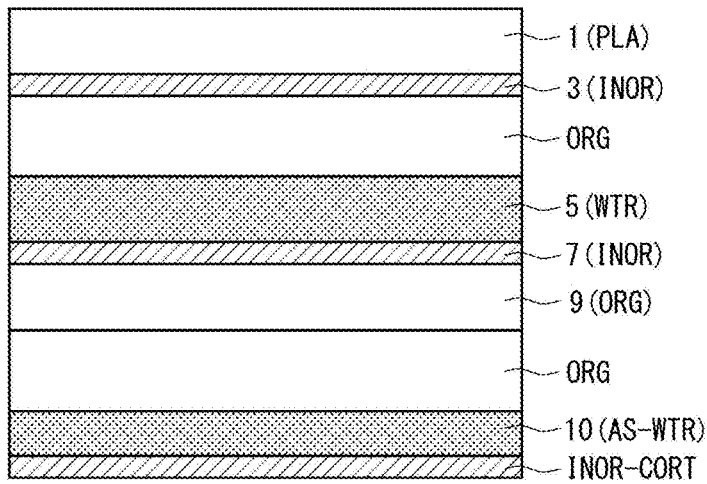
FIG. 14 is a schematic sectional view showing a structure of layers of water barrier laminates prepared in Examples 19 and 20.

In the gloved box adjusted to a nitrogen concentration of not less than 99.95%, the INOR-coated PET film X1 was dry-laminated on the auxiliary water-trapping layer (AS-WTR) of the water-barrier laminate (1) prepared in Example 1 via a 3 μm-thick epoxy type adhesive layer in a manner that the INOR layer was on the outside, to thereby obtain a water-barrier laminate (21) of the structure of layers shown in FIG. 13.

Example 22

Figure 15:
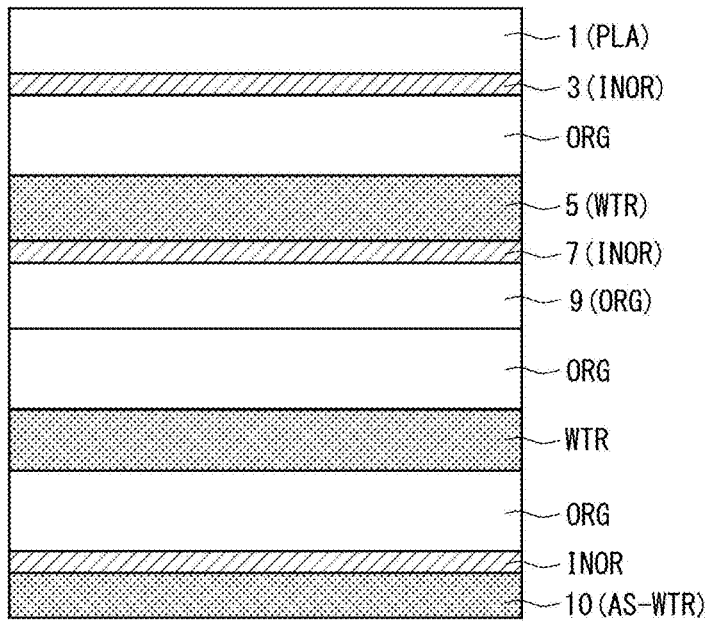
FIG. 15 is a schematic sectional view showing a structure of layers of a water barrier laminate prepared in Example 22.

A water-barrier laminate (22) of a structure of layers shown in FIG. 15 was obtained by forming an auxiliary water-trapping layer (AS-WTR) in the same manner as in Example 1 on the water-barrier laminate (21) prepared in Example 21.

Example 23

Figure 16:
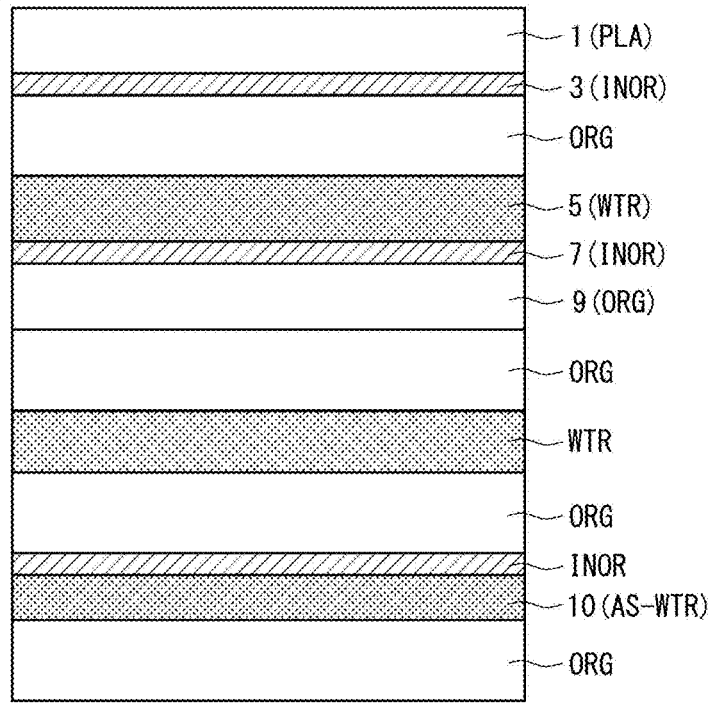
FIG. 16 is a schematic sectional view showing a structure of layers of a water barrier laminate prepared in Example 23.

A water-barrier laminate (23) of a structure of layers shown in FIG. 16 was obtained by forming an organic layer (ORG) in the same manner as in Example 17 on the auxiliary water-trapping layer (AS-WTR) of the water-barrier laminate (22) prepared in Example 22.

Example 24

The coating solution A for forming the water-trapping layer was applied, by using the bar coater, on one surface of the laminated film B prepared in Example 10. The laminated film B after having been applied was heat-treated in the box type electric oven under the conditions of a peak temperature of 120° C. and a peak temperature-holding time of 10 seconds to form a water-trapping layer (WTR) in a thickness of 4 μm. Next, an auxiliary water-trapping layer (AS-WTR) was formed in a thickness of 3 μm by the same method on the other surface of the laminated film B to thereby obtain a film J.

Figure 17:
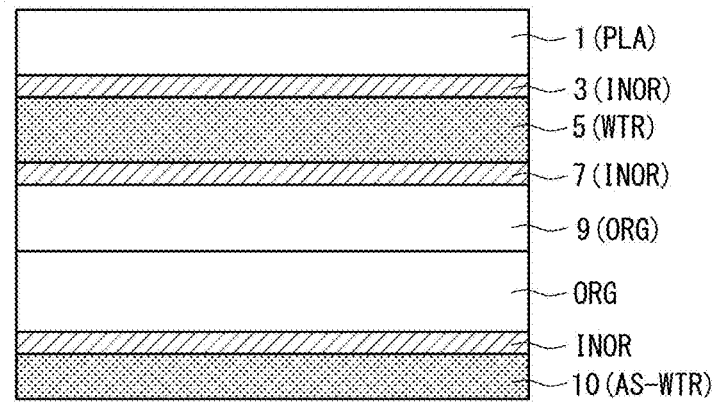
FIG. 17 is a schematic sectional view showing a structure of layers of a water barrier laminate prepared in Example 24.

Next, in the gloved box adjusted to a nitrogen concentration of not less than 99.95%, the INOR-coated PET film X1 was dry-laminated on the WTR layer of the film J via a 3 μm-thick epoxy adhesive layer in a manner that the INOR layer was on the inside, to thereby obtain a water-barrier laminate (24) of a structure of layers shown in FIG. 17.

Example 25

Figure 18:
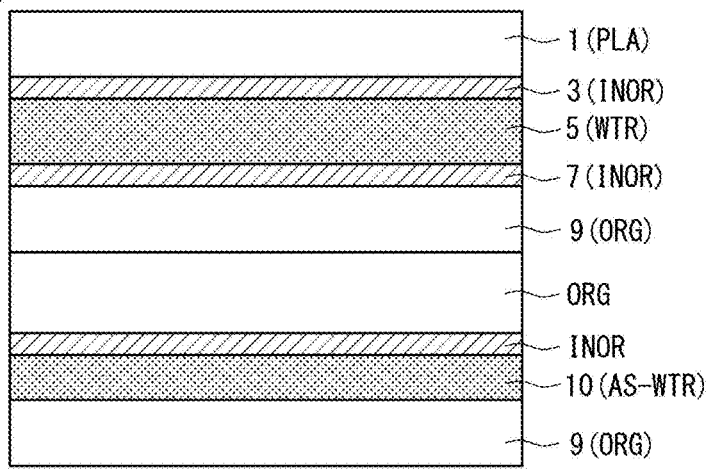
FIG. 18 is a schematic sectional view showing a structure of layers of a water barrier laminate prepared in Example 25.

A water-barrier laminate (25) of a structure of layers shown in FIG. 18 was obtained by forming an organic layer (ORG) in a thickness of 4 μm in the same manner as in Example 17 on the AS-WTR layer of the water-barrier laminate (24) prepared in Example 24.

Example 26

Figure 19:
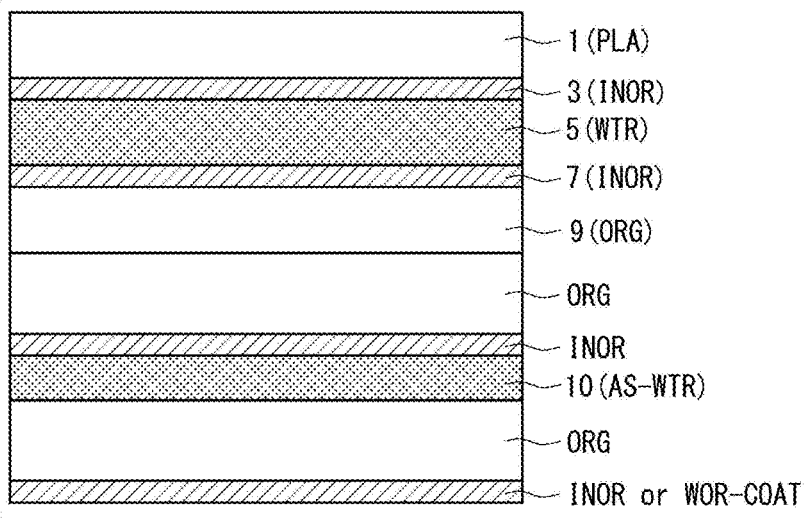
FIG. 19 is a schematic sectional view showing a structure of layers of water barrier laminates prepared in Examples 26 and 29.

A water-barrier laminate (26) of a structure of layers shown in FIG. 19 was obtained by forming an inorganic barrier layer (INOR) of silicon oxide in the same manner as in Example 18 on the organic layer (ORG) of the water-barrier laminate (25) prepared in Example 25.

Example 27

Figure 20:
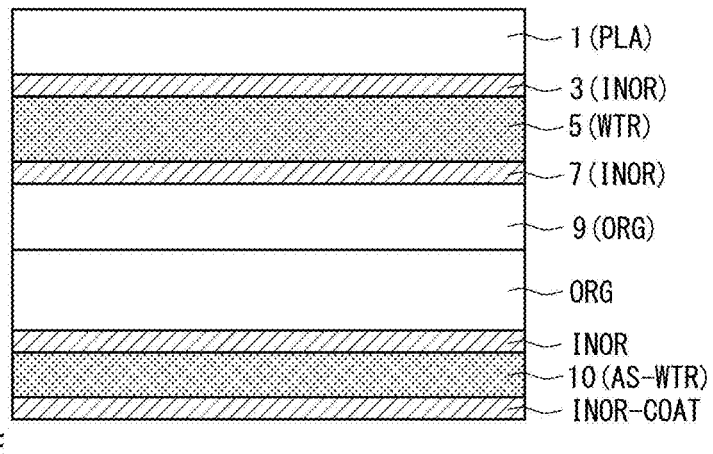
FIG. 20 is a schematic sectional view showing a structure of layers of water barrier laminates prepared in Examples 27 and 28.
Figure 21:
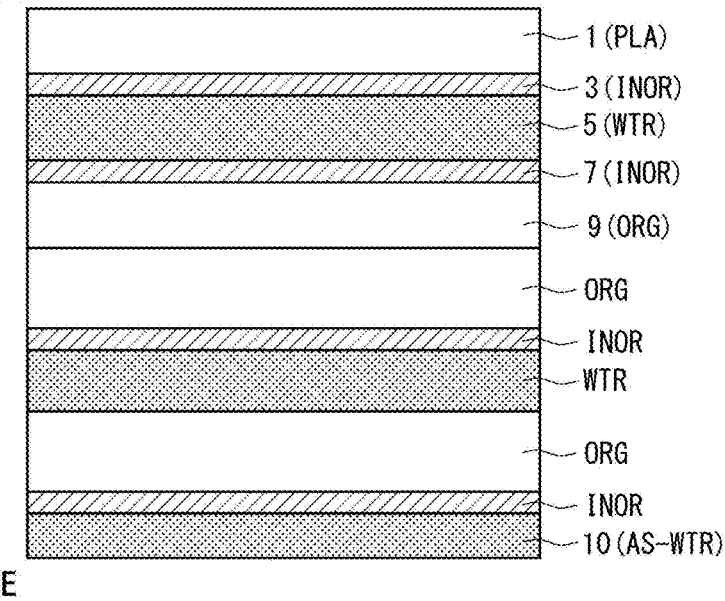
FIG. 21 is a schematic sectional view showing a structure of layers of a water barrier laminate prepared in Example 30.

A water-barrier laminate (27) of a structure of layers shown in FIG. 20 was obtained by forming a polysilazane type inorganic barrier layer (INOR-COAT) in the same manner as in Example 19 on the auxiliary water-trapping layer (AS-WTR) of the water-barrier laminate (24) prepared in Example 24.

Example 28

A water-barrier laminate (28) of a structure of layers shown in FIG. 20 was obtained by forming an alumina type inorganic barrier layer (INOR-COAT) in the same manner as in Example 20 on the auxiliary water-trapping layer (AS-WTR) of the water-barrier laminate (24) prepared in Example 24.

Example 29

In the gloved box adjusted to a nitrogen concentration of not less than 99.95%, the INOR-coated PET film X1 was dry-laminated on the auxiliary water-trapping layer (AS-WTR) of the water-barrier laminate (24) prepared in Example 24 via a 3 µm-thick epoxy type adhesive layer in a manner that the INOR layer was on the outside, to thereby obtain a water-barrier laminate (29) of the structure of layers shown in FIG. 19.

Example 30

A water-barrier laminate (30) of a structure of layers shown in FIG. 20 was obtained by forming an auxiliary water-trapping layer (AS-WTR) in the same manner as in Example 1 on the INOR layer of the auxiliary water-trapping layer (29) prepared in Example 29.

Example 31

Figure 22:
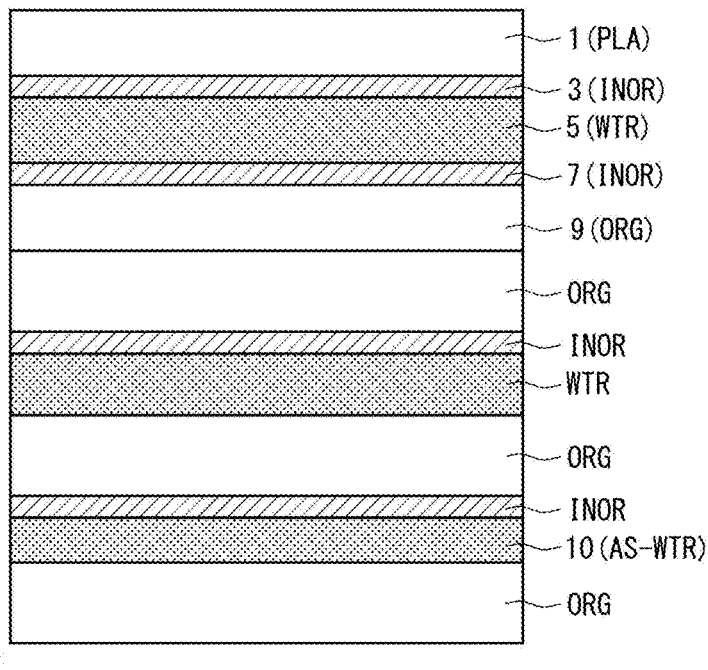
FIG. 22 is a schematic sectional view showing a structure of layers of a water barrier laminate prepared in Example 31.

A water-barrier laminate (31) of a structure of layers shown in FIG. 22 was obtained by forming an organic layer (ORG) in the same manner as in Example 17 on the auxiliary water-trapping layer (AS-WTR) of the water-barrier laminate (30) prepared in Example 30.

Example 32

Figure 23:
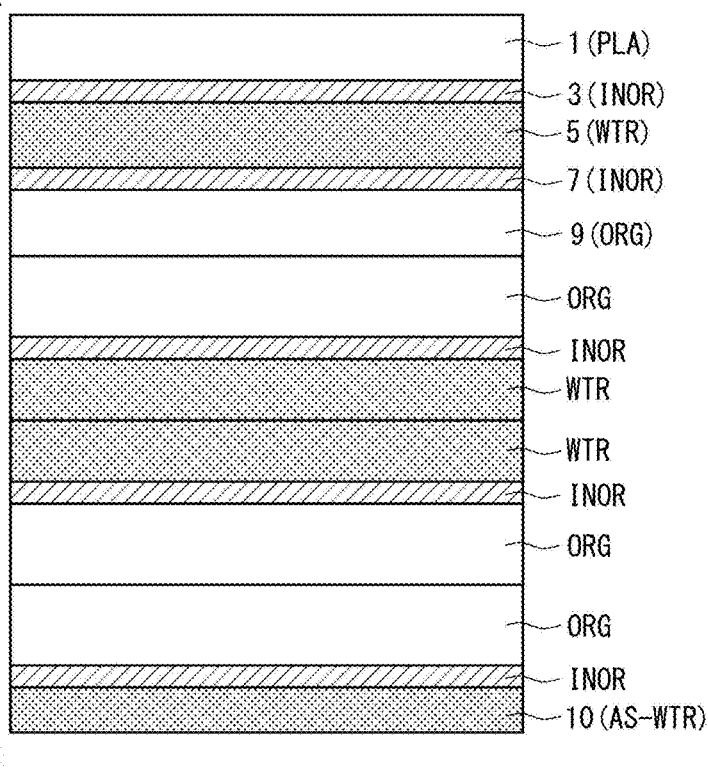
FIG. 23 is a schematic sectional view showing a structure of layers of a water barrier laminate prepared in Example 32.
Figure 24:
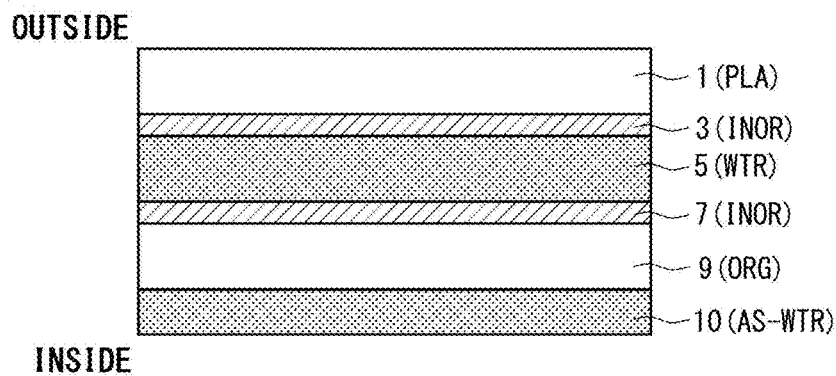
FIG. 24 is a schematic sectional view showing a structure of layers of a water barrier laminate prepared in Example 33.

In the gloved box adjusted to a nitrogen concentration of not less than 99.95%, the film J (see Example 24) was dry-laminated on the auxiliary water-trapping layer (AS-WTR) of the water-barrier laminate (24) prepared in Example 24 via a 3 µm-thick epoxy type adhesive layer in a manner that the WTR layer was on the inside, to thereby obtain a water-barrier laminate (32) of a structure of layers shown in FIG. 23.

Example 33

The coating solution A for forming the water-trapping layer was applied, by using the bar coater, onto the INOR later of the INOR-coated PET film X1. The film after having been applied was heat-treated in the box type electric oven under the conditions of a peak temperature of 120° C. and a peak temperature-holding time of 10 seconds to form a water-trapping layer (WTR) in a thickness of 4 µm to thereby obtain a film K.

Next, in the gloved box adjusted to a nitrogen concentration of not less than 99.95%, the INOR-coated PET film X1 was dry-laminated on the layer WTR of the film K via a 3 µm-thick epoxy type adhesive layer in a manner that the INOR layer was on the inside, to thereby obtain a laminated film K.

Next, the coating solution A was applied, by using the bar coater, onto the PET surface of the laminated film K on the side close to the adhesive layer. The film after having been applied was heat-treated in the box type electric oven under the conditions of a peak temperature of 120° C. and a peak temperature-holding time of 10 seconds to form an auxiliary water-trapping layer (AS-WTR) in a thickness of 3 µm to thereby obtain a water-barrier laminate (33) of a structure of layers shown in FIG. 24.

Example 34

A laminated film L1 was obtained by forming a water-trapping layer (WTR) in the same manner as in Example 1 on the INOR layer of the laminated film C used in Example 11.

Further, a laminated film L2 was obtained by forming a 3 µm-thick auxiliary water-trapping layer (AS-WTR) on the INOR layer of the laminated film C in the same manner as described above.

Next, in the gloved box adjusted to a nitrogen concentration of not less than 99.95%, the INOR-coated PET film X1 was dry-laminated on the water-trapping layer 5 of the laminated film L1 via a 3 µm-thick epoxy type adhesive layer in a manner that the INOR layer was on the inside, to thereby obtain a laminated film M.

Figure 25:
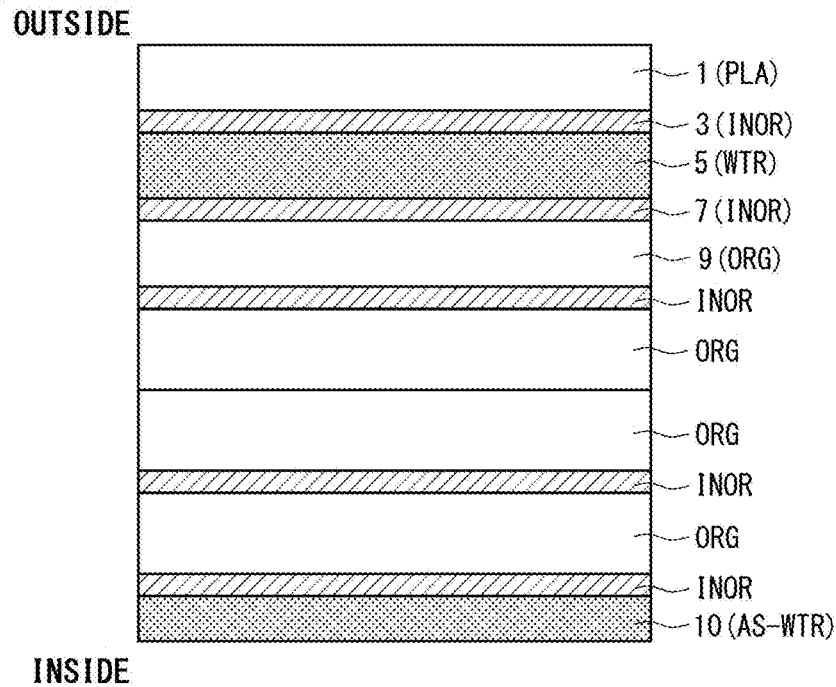
FIG. 25 is a schematic sectional view showing a structure of layers of a water barrier laminate prepared in Example 34.

Next, the laminated film L2 was dry-laminated, via a 3 µm-thick epoxy type adhesive layer, onto the PET surface of the laminated film M on the side close to the adhesive layer in a manner that the PET surface of the laminated film L2 was on the inside, to thereby obtain a water-barrier laminate (34) of a structure of layers shown in FIG. 25.

Example 35

In the gloved box adjusted to a nitrogen concentration of not less than 99.95%, the laminated film L1 was dry-laminated on PET surface of the laminated film M prepared in Example 34 on the side close to the adhesive layer via a 3 µm-thick epoxy type adhesive layer in a manner that the layer WTR 5 was on the inside, to thereby obtain a laminated film N.

Figure 26:
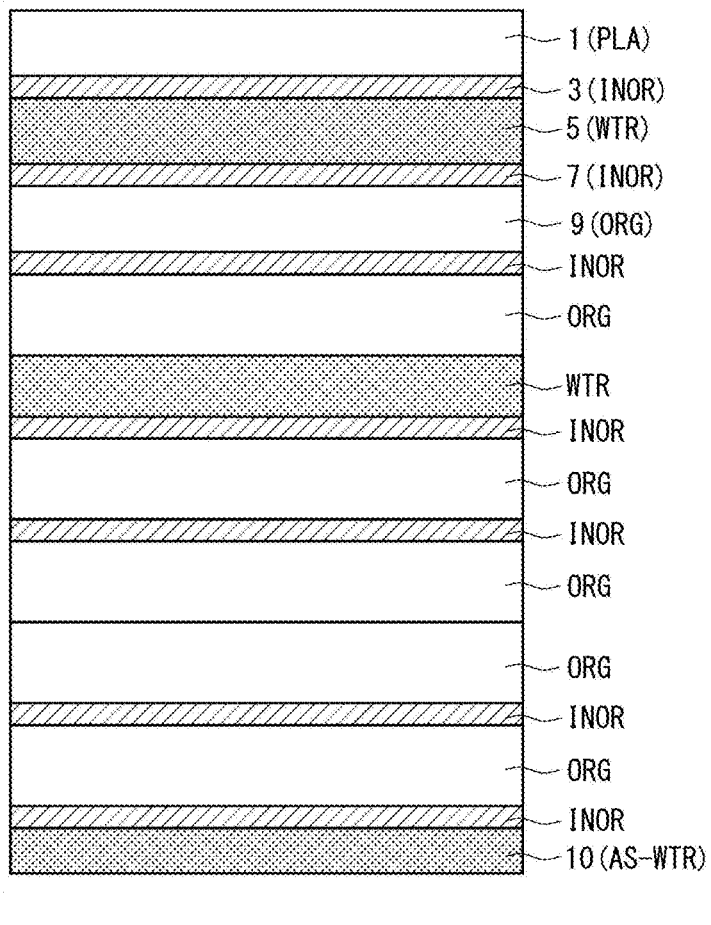
FIG. 26 is a schematic sectional view showing a structure of layers of a water barrier laminate prepared in Example 35.

Next, the laminated film L2 was dry-laminated, via a 3 µm-thick epoxy type adhesive layer, onto the PET surface of the laminated film N on the side close to the adhesive layer in a manner that the PET surface of the laminated film L2 was on the inside, to thereby obtain a water-barrier laminate (35) of a structure of layers shown in FIG. 26.

Example 36

Figure 27:
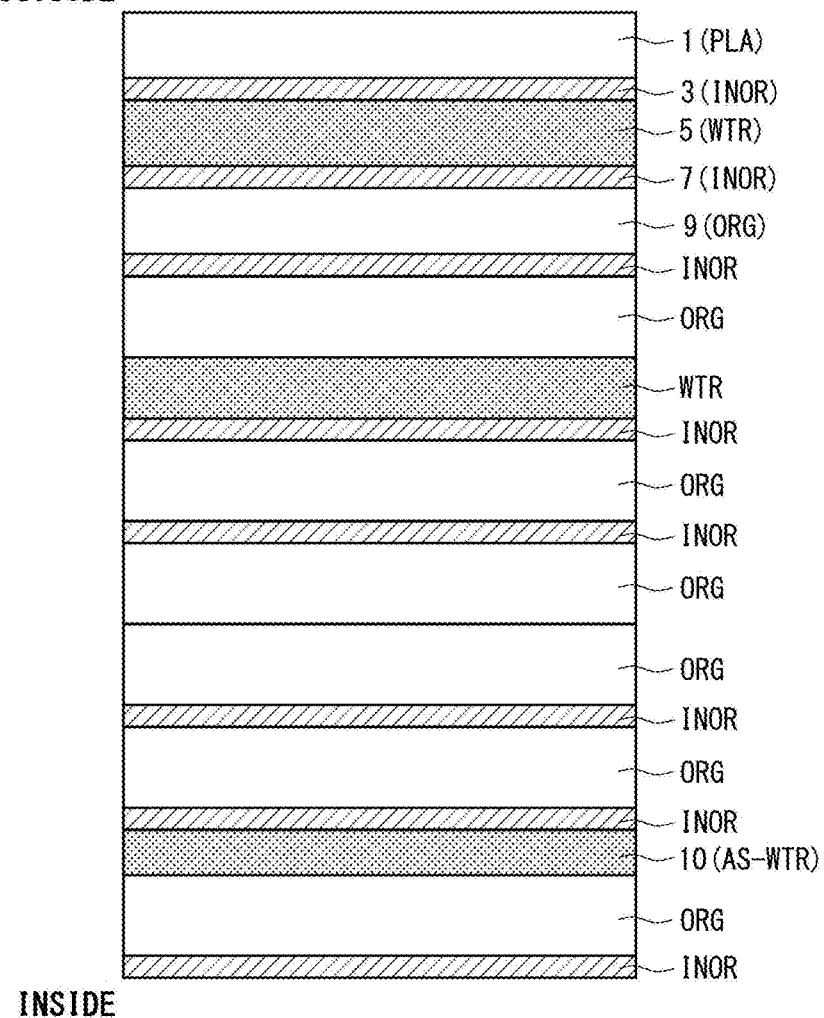
FIG. 27 is a schematic sectional view showing a structure of layers of a water barrier laminate prepared in Example 36.

In the gloved box adjusted to a nitrogen concentration of not less than 99.95%, the INOR-coated PET film X1 was dry-laminated on the auxiliary water-trapping layer (AS-WTR) of the water-barrier laminate (35) prepared in Example 35 via a 3 µm-thick epoxy type adhesive layer in a manner that the INOR layer was on the outside, to thereby obtain a water-barrier laminate (36) of a structure of layers shown in FIG. 27.

Comparative Example 1

Figure 28:
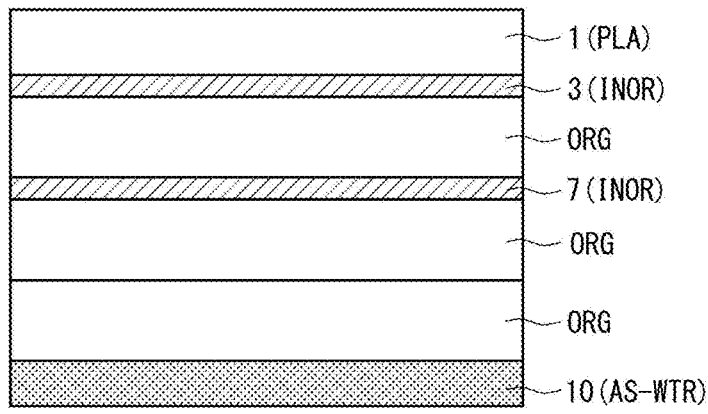
FIG. 28 is a schematic sectional view showing a structure of layers of a water barrier laminate prepared in Comparative Example 1.

A water-barrier laminate (C-1) of a structure of layers shown in FIG. 28 was obtained in the same manner as in Example 1 but without forming the water-trapping layer (WTR).

Comparative Example 2

Figure 29:
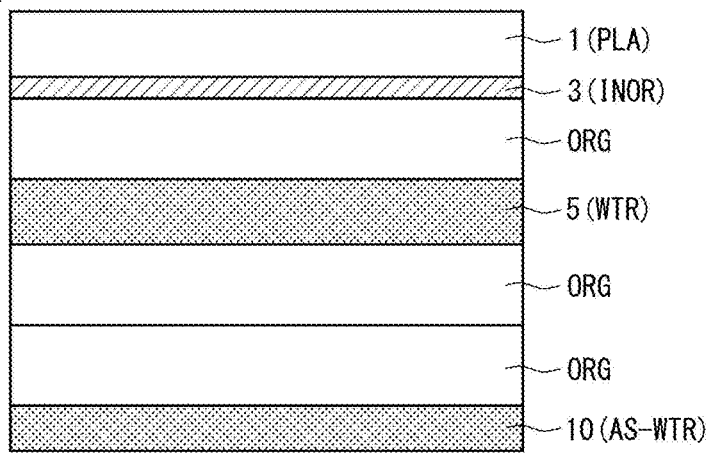
FIG. 29 is a schematic sectional view showing a structure of layers of a water barrier laminate prepared in Comparative Example 2.

A water-barrier laminate (C-2) of a structure of layers shown in FIG. 29 was obtained in the same manner as in Example 1 but without forming the inorganic barrier layer (INOR) for the INOR-coated PET film X1 on the side close to the auxiliary water-trapping layer (AS-WTR).

Comparative Example 3

Figure 30:
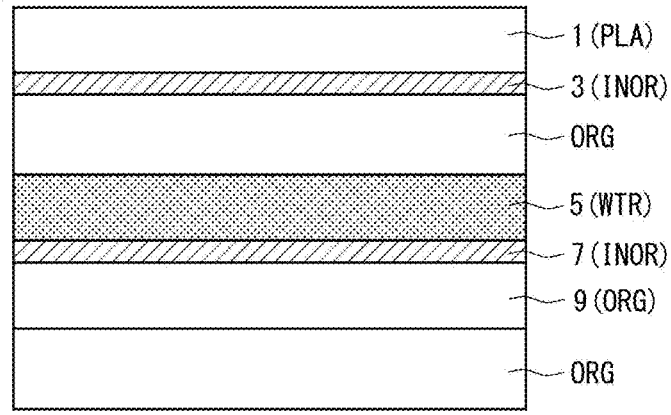
FIG. 30 is a schematic sectional view showing a structure of layers of a water barrier laminate prepared in Comparative Example 3.

A water-barrier laminate (C-3) of a structure of layers shown in FIG. 30 was obtained in the same manner as in Example 1 but without forming the auxiliary water-trapping layer (AS-WTR).

Comparative Example 4

A water-barrier laminate (C-4) of the structure of layers shown in FIG. 13 was obtained in the same manner as in Example 21 but changing the thickness of the PET material of the INOR-coated film X1 of the innermost side into 50 µm.

<Evaluation>

The water-barrier laminates prepared above were measured for their properties by the methods described above. The results were as shown in Tables 1 to 3.

TABLE 1

| | WTR(5) Film thickness (µm) | INOR(7) | AS-WTR Film thickness (µm) | Innermost surface | Distance between AS-WTR and inner surface (µm) | WVTR (g/m$^2$/day) | Side surface H$_2$O barrier | Desiccant |
|---|---|---|---|---|---|---|---|---|
| Ex. 1 | cation (4) | yes | cation (3) | AS-WTR | 0 | ◎ ($\leq 10^{-5}$) | ○ | ○ |
| Ex. 2 | cation (4) | yes | cation (8) | AS-WTR | 0 | ◎ ($\leq 10^{-5}$) | ○ | ○ |
| Ex. 3 | cation (4) | yes | cation (3) | AS-WTR | 0 | ◎ ($\leq 10^{-5}$) | ○ | ○ |
| Ex. 4 | anion (4) | yes | anion (3) | AS-WTR | 0 | ◎ ($\leq 10^{-5}$) | ○ | ○ |
| Ex. 5 | cation (4) | yes | cation (3) | AS-WTR | 0 | ◎ ($\leq 10^{-5}$) | ○ | ○ |
| Ex. 6 | cation (4) | yes | cation (3) | AS-WTR | 0 | ◎ ($\leq 10^{-5}$) | ○ | ○ |
| Ex. 7 | cation (4) | yes | cation (3) | AS-WTR | 0 | ◎ ($\leq 10^{-5}$) | ○ | ○ |
| Ex. 8 | cation (4) | yes | cation (3) | AS-WTR | 0 | ◎ ($\leq 10^{-5}$) | ○ | ○ |
| Ex. 9 | cation (4) | yes | cation (3) | AS-WTR | 0 | ◎ ($\leq 10^{-5}$) | ○ | ○ |
| Ex. 10 | cation (4) | yes | cation (3) | AS-WTR | 0 | ◎ ($\leq 10^{-5}$) | ○ | ○ |
| Ex. 11 | cation (4) | yes | cation (3) | AS-WTR | 0 | ◎ ($\leq 10^{-5}$) | ○ | ○ |
| Ex. 12 | cation (4) | yes | cation (3) | AS-WTR | 0 | ◎ ($\leq 10^{-5}$) | ○ | ○ |
| Ex. 13 | cation (4) | yes | cation (3) | AS-WTR | 0 | ◎ ($\leq 10^{-5}$) | ○ | ○ |
| Ex. 14 | cation (4) | yes | cation (3) | AS-WTR | 0 | ◎ ($\leq 10^{-5}$) | ○ | ○ |

TABLE 2

| | WTR(5) Film thickness (µm) | INOR(7) | AS-WTR Film thickness (µm) | Innermost surface | Distance between AS-WTR and inner surface (µm) | WVTR (g/m$^2$/day) | Side surface H$_2$O barrier | Desiccant |
|---|---|---|---|---|---|---|---|---|
| Ex. 15 | cation (4) | yes | cation (3) | AS-WTR | 0 | ◎ ($\leq 10^{-5}$) | ○ | ○ |
| Ex. 16 | cation (4) | yes | cation (3) | AS-WTR | 0 | ◎ ($\leq 10^{-5}$) | ○ | ○ |
| Ex. 17 | cation (4) | yes | cation (3) | ORG | 4.0 | ◎ ($\leq 10^{-5}$) | ○ | ○ |
| Ex. 18 | anion (4) | yes | anion (3) | INOR | 4.1 | ◎ ($\leq 10^{-5}$) | ○ | ○ |
| Ex. 19 | cation (4) | yes | cation (3) | INOR-COAT (Si) | 1.0 | ◎ ($\leq 10^{-5}$) | ○ | ○ |
| Ex. 20 | cation (4) | yes | cation (3) | INOR-COAT (Al) | 0.8 | ◎ ($\leq 10^{-5}$) | ○ | ○ |
| Ex. 21 | cation (4) | yes | cation (3) | GB | 16 | ◎ ($\leq 10^{-5}$) | ○ | X |
| Ex. 22 | cation (4) | yes | cation (3) | AS-WTR | 0 | ◎ ($\leq 10^{-5}$) | ○ | ○ |
| Ex. 23 | cation (4) | yes | cation (3) | ORG | 4.0 | ◎ ($\leq 10^{-5}$) | ○ | ○ |

TABLE 2-continued

| | WTR(5) Film thickness (μm) | INOR(7) | AS-WTR Film thickness (μm) | Innermost surface | Distance between AS-WTR and inner surface (μm) | WVTR (g/m²/day) | Side surface $H_2O$ barrier | Desiccant |
|---|---|---|---|---|---|---|---|---|
| Ex. 24 | cation (4) | yes | cation (3) | AS-WTR | 0 | ◎ ($\leq 10^{-5}$) | ○ | ○ |
| Ex. 25 | anion (4) | yes | anion (3) | ORG | 4.0 | ◎ ($\leq 10^{-5}$) | ○ | ○ |
| Ex. 26 | cation (4) | yes | cation (3) | INOR | 4.1 | ◎ ($\leq 10^{-5}$) | ○ | ○ |
| Ex. 27 | cation (4) | yes | cation (3) | INOR-COAT (Si) | 1.0 | ◎ ($\leq 10^{-5}$) | ○ | ○ |

TABLE 3

| | WTR(5) Film thickness (μm) | INOR(7) | AS-WTR Film thickness (μm) | Innermost surface | Distance between AS-WTR and inner surface (μm) | WVTR (g/m²/day) | Side surface $H_2O$ barrier | Desiccant |
|---|---|---|---|---|---|---|---|---|
| Ex. 28 | cation (4) | yes | cation (3) | INOR-COAT (Al) | 0.8 | ◎ ($\leq 10^{-5}$) | ○ | ○ |
| Ex. 29 | cation (4) | yes | cation (3) | GB | 16 | ◎ ($\leq 10^{-5}$) | ○ | X |
| Ex. 30 | cation (4) | yes | cation (3) | AS-WTR | 0 | ◎ ($\leq 10^{-5}$) | ○ | ○ |
| Ex. 31 | anion (4) | yes | anion (3) | ORG | 4.0 | ◎ ($\leq 10^{-5}$) | ○ | ○ |
| Ex. 32 | cation (4) | yes | cation (3) | AS-WTR | 0 | ◎ ($\leq 10^{-5}$) | ○ | ○ |
| Ex. 33 | cation (4) | yes | cation (3) | AS-WTR | 0 | ◎ ($\leq 10^{-5}$) | ○ | ○ |
| Ex. 34 | cation (4) | yes | cation (3) | AS-WTR | 0 | ◎ ($\leq 10^{-5}$) | ○ | ○ |
| Ex. 35 | cation (4) | yes | cation (3) | AS-WTR | 0 | ◎ ($\leq 10^{-5}$) | ○ | ○ |
| Ex. 36 | cation (4) | yes | cation (3) | GB(INOR) | 16 | ◎ ($\leq 10^{-5}$) | ○ | X |
| C-Ex. 1 | — | yes | cation (3) | AS-WTR | 0 | X ($\leq 10^{-3}$) | X | ○ |
| C-Ex. 2 | cation (4) | no | cation (3) | AS-WTR | 0 | X ($\leq 10^{-3}$) | X | ○ |
| C-Ex. 3 | cation (4) | yes | — | — | — | X ($\leq 10^{-3}$) | X | X |
| C-Ex. 4 | cation (4) | yes | cation (3) | GB(INOR) | 54 | X ($\leq 10^{-3}$) | X | X |

Next, the following reference experiments were conducted in order to evaluate properties of the inorganic barrier layers (INOR-COAT) formed by using the polysilazane composition.

In conducting various tests, the INOR-COAT layers were measured and evaluated as described below.

<Evaluating the Water Vapor Permeability (g/m²/Day)>

The water vapor permeability was measured by the same method as the one described above, and was evaluated on the following basis.

○: The water vapor permeability was less than $10^{-3}$ g/m²/day.

Δ: The water vapor permeability was not less than $10^{-3}$ g/m²/day but was less than 1 g/m²/day.

X: The water vapor permeability was not less than 1 g/m²/day.

<Measuring the Atomic Weight (Atomic %) of C>

By using a fully automated X-ray photoelectron spectrometer, the organic/inorganic composite film was measured for the ratio of presence of carbon atoms and silicon atoms under the following conditions.

Measuring Apparatus:
K-Alpha, manufactured by Thermo Fischer Scientific Co.
X-ray source: Ar
Ionic energy: 2000 eV
Degree of vacuum: $6.0 \times 10^{-8}$ Pa <Evaluating the Flexibility of Films>

The inorganic barrier film (INOR-COAT) was folded into a half at the central portion and was passed through between the two rolls of a laminator (LAMIPACKER LPC1502 manufactured by Fujipla Co.) under the conditions of a laminating rate of 5 m/min and a temperature of 23° C. Thereafter, the occurrence of cracks was evaluated with the eye on the following basis.

○: No crack occurred.

X: Cracks occurred.

<Strength of Adhesion>

To secure the strength of a film against the tensile test, a 7 μm-thick aluminum foil was dry-laminated, via a 4 μm-thick epoxy type adhesive agent, on both the surface of the sample INOR-COAT and the PET surface of the underlying layer. The laminate was aged at 50° C. for 3 days to cure the adhesive to thereby prepare a sample for T-peel test.

The sample for the T-peel test was cut into a short strip measuring 100 mm×15 mm and was subjected to the T-peel test by using a tension tester at a tensile rate of 300 mm/min (N=3). Here, an average strength was regarded to be the strength of adhesion and was evaluated on the following basis.

○: An average strength of adhesion was not less than 2 (N/15 mm).
Δ: An average strength of adhesion was not less than 1 (N/15 mm) but was less than 2 (N/15 mm).
X: An average strength of adhesion was less than 1 (N/15 mm).

Reference Experiment 1

A coating solution G containing the polysilazane as the film-forming component was prepared by using a polymer solution of a cyclic olefin copolymer (COC) in the same manner as in Example 19 described above.

The coating solution G was applied, by using the bar coater, onto a 100 μm-thick PET film (Lumirror produced by Toray Co.) and was heat-treated in the box type electric oven under the conditions of a peak temperature of 150° C. for a peak temperature-holding time of 3 minutes to form a layer in a thickness of 1 μm on the PET film.

Next, by using the excimer irradiator (MEIRA-M-1-152-H2 manufactured by M.D. Excimer Co.), the layer was cured under the following curing conditions to form an inorganic barrier layer (INOR-COAT) on the PET film.
(Curing Conditions)
Luminous intensity: 60 mW/cm$^2$ (172 nm)
Stage-heating temperature: 80° C.
Irradiation distance: 3 mm
Conveying speed: 1 m/min
Frequency of conveyance: 10 times (5 round trips)
Oxygen concentration: 0%

Reference Experiment 2

An inorganic barrier film was formed in the same manner as in Reference Experiment 1 but so preparing the solution that the amount of the perhydropolysilazane was 20% by weight and the amount of the COC polymer solution was 80% by weight.

Reference Experiment 3

An inorganic barrier film was formed in the same manner as in Reference Experiment 1 but so preparing the solution that the amount of the perhydropolysilazane was 40% by weight and the amount of the COC polymer solution was 60% by weight.

Reference Experiment 4

An inorganic barrier film was formed in the same manner as in Reference Experiment 1 but so preparing the solution that the amount of the perhydropolysilazane was 60% by weight and the amount of the COC polymer solution was 40% by weight.

Reference Experiment 5

The following cycloolefin copolymer (COP) was provided as the fluorine-free hydrophobic resin.
COP; ZEONOR 1020R produced by Zeon Co.
A polymer solution containing 20% by weight of a solid component was obtained in the same manner as in Reference Experiment 1 but using the above COP instead of the COC.

Next, the solution was so adjusted as to contain the perhydropolysilazane in an amount of 20% by weight and the COP polymer solution in an amount of 80% by weight. The solution was, further, adjusted with xylene and with good stirring such that the amount of the solid component was 10% by weight. There was thus prepared a coating solution containing the polysilazane as the film-forming component, and from which an inorganic barrier film was formed in the same manner as in Reference Experiment 1.

Reference Experiment 6

An inorganic barrier film was formed in the same manner as in Reference Experiment 1 but so adjusting the solution that the amount of the perhydropolysilazane was 70% by weight and the amount of the COC polymer solution was 30% by weight.

<Reference Experiment C1>
An organic film was formed on the PET film used in Reference Experiment 1 by directly using the COC polymer solution as the coating solution.

<Reference Experiment C2>
An inorganic barrier film was formed in the same manner as in Reference Experiment 1 but preparing a coating solution G without using the COC polymer solution.

<Reference Experiment C3>
A polymethylmethacrylate PMMA (Sumipex LG produced by Sumitomo Chemical Co., Ltd.) was provided.
The PMMA was dissolved in xylene to obtain a polymer solution containing 20% by weight of a solid component.
An inorganic barrier film was formed by preparing a coating composition in the same manner as in Reference Experiment 2 but mixing the perhydropolysilazane (20% by weight) and the above polymer solution (80% by weight) together.

<Reference Experiment C4>
A polymer solution was prepared by using a fluorine-contained resin (Fluonate K704 produced by DIC Co.) instead of using the COC. The polymer solution was then mixed with the perhydropolysilazane to prepare a coating composition that contained the polysilazane as the film-forming component. In other respects, the procedure was carried out in the same manner as in Reference Experiment 2 to form an inorganic barrier film.

<Evaluation>
The inorganic barrier films or the organic films formed on the PET films mentioned above were measured for their properties by the methods described above. The results were as shown in Table 4.

Here, FIG. 31 shows the distribution of atoms in the inorganic barrier film formed in Reference Experiment 1 in the direction of thickness thereof.

TABLE 4

|  | Fluorine-free resin (amount %) | Amount of C atoms (Atomic %) | Adhesiveness | WVTR (g/m$^2$ · day) | Flexibility |
|---|---|---|---|---|---|
| REx-1 | COC (95) | 2.2 | ○ | ○ | ○ |
| REx-2 | COC (80) | 0.7 | ○ | ○ | ○ |
| REx-3 | COC (60) | 3.5 | ○ | ○ | ○ |
| REx-4 | COC (40) | 4.7 | ○ | ○ | ○ |
| REx-5 | COP (80) | 7.9 | ○ | ○ | ○ |

TABLE 4-continued

| | Fluorine-free resin (amount %) | Amount of C atoms (Atomic %) | Adhesiveness | WVTR (g/m² · day) | Flexibility |
|---|---|---|---|---|---|
| REx-6 | COC (30) | 9 | ○ | Δ | ○ |
| REx-C1 | COC (100) | 98 | X | X | ○ |
| REx-C2 | — (0) | 0 | ○ | Δ (cracked) | X |
| REx-C3 | PMMA (80) | 78 | ○ | X | ○ |
| REx-C4 | * (80) | 40 | X | X | ○ |

* fluorine-contained resin

Next, the following Reference Experiments were conducted in order to evaluate improvements in the life of the water-trapping layer (WTR) depending on the organic layer (ORG) that has a large thickness and a water-diffusing function.

In the Reference Experiments, various measurements were taken based on the methods described below.

<Water Vapor Permeability (g/m²/Day) of the Laminate>

The laminate was set to a measuring cell in a manner that the organic layer (ORG) was located (on the outer surface side) closer to the side of the high-humidity atmosphere than the water-trapping layer (WTR) was. By using a water vapor permeability measuring apparatus (Permatran-W manufactured by Modern Control Co.), the laminate was measured for its water vapor permeability in compliance with the ASTM-F1249 under the conditions of a temperature of 40° C. and a relative humidity of 90% (measurable limit=0.01 g/m²/day).

<Determining the Water Vapor Permeation Coefficient of the Resin for Forming the Organic Layer>

A resin sheet prepared by using the resin for forming the organic layer (ORG) was measured for its water vapor permeability by the method described above, and the obtained value was converted into a value per a millimeter of thickness of the sheet and was regarded to be a water vapor permeation coefficient of the resin that formed the organic layer.

<Evaluating the Long-Term Stability>

The laminates were measured for their water vapor permeabilities for every regular time interval by the above-mentioned method and were evaluated for their long-term stabilities in their water-barrier property on the following basis.

⊚: No rise in the permeation of humidity was recognized even after the passage of time of 100 hours or more.
○: No rise in the permeation of humidity was recognized even after the passage of time of 50 hours or more.
X: A rise in the permeation of humidity was recognized in less than 50 hours.

Reference Experiment 7

An INOR-coated PET film X3 having an inorganic barrier layer of silicon oxide formed on one surface of the PET film was prepared in the same manner as in Example 1 mentioned above but changing the thickness of the biaxially stretched PET film into 100 μm and changing the time for forming the film into 20 seconds.

The INOR-coated PET film X3 was measured for its water vapor permeability to be 0.1 g/m²/day as measured in an atmosphere of 40° C. and 90% RH.

A coating solution A for forming a water-trapping layer was prepared in quite the same manner as in Example 1 described earlier by using a crosslinked product of polyallylamine (cationic polymer) and Na polyacrylate.

By using the coating solution A, a water-trapping layer (WTR) having a thickness of 4 μm was formed on the PET surface of the above INOR-coated PET film X3 in the same manner as in Example 1 to thereby obtain a film A.

Next, in the gloved box adjusted to a nitrogen concentration of not less than 99.95%, the above INOR-coated PET film X3 was dry-laminated on the layer of the film A via a 4 μm-thick urethane type adhesive layer (PU) in a manner that the INOR layer was on the inside. The laminate was aged in vacuum at 50° C. for 3 days to cure the adhesive resin layer so will not to absorb the moisture. Thus, the adhesive layer was cured so will not to absorb the moisture, and there was obtained a laminate (R7) of a structure of layers described below.

In the structure of layers described below, the PET in the INOR-coated PET film X3 arranged on the outer surface side was the organic layer (ORG).

Outer surface side (high-humidity atmosphere side)→inner surface side (low-humidity atmosphere side) INOR/ORG(PET)/WTR/PU/INOR/PET Reference Experiment 8

A laminate (R8) of the structure of layers same as that of Reference Experiment 7 was obtained in the same manner as in Reference Experiment 7 but changing the thickness of the PET film of the INOR-coated PET film X3 into 12 μm.

Reference Experiment 9

A laminate (R9) of the structure of layers same as that of Reference Experiment 7 was obtained in the same manner as in Reference Experiment 7 but using a commercially available vapor-deposited PET film (Techbarrier Type HX produced by Mitsubishi Plastics, Inc.) formed by the PVD method instead of using the INOR-coated PET film X3.

Reference Experiment 10

The coating solution A prepared in Reference Experiment 7 was applied, by using the bar coater, onto the vapor-deposited surface of the INOR-coated PET film X3 used in Reference Experiment 7. The film after applied was heat-treated in the box type electric oven under the conditions of a peak temperature of 120° C. for a peak temperature-holding time of 10 seconds to form a water-trapping layer (WTR) 4 μm in thickness to thereby obtain a film B.

An EVOH film (EF-F produced by Kuraray Co.) having a thickness of 12 μm was provided as the gas-barrier film (GB).

In the gloved box adjusted to a nitrogen concentration of not less than 99.95%, there were successively dry-laminated a 4 μm-thick urethane adhesive layer (PU), a gas-barrier film (GB), a 4 μm-thick urethane adhesive layer (PU) and the above INOR-coated PET film X3 on the WTR layer of the film B in such a manner that the INOR layer was on the inside. The laminate was aged in vacuum at 50° C. for 3 days to obtain a laminate (R10) having a structure of layers described below.

Here, in the structure of layers described below, the three laminated layers, i.e., adhesive layer (PU), gas-barrier film (GB) and adhesive layer (PU), served as the organic layer (ORG).

Outer surface side (high-humidity atmosphere side)→inner surface side (low-humidity atmosphere side) PET/INOR/ORG (PU/GB/PU)/WTR/INOR/PET Reference Experiment 11

A laminate (R11) of the structure of layers same as that of Reference Experiment 10 was obtained in the same manner as in Reference Experiment 10 but using, as the gas-barrier film, a biaxially stretched nylon film of a thickness of 15 μm instead of using the EVOH film of a thickness of 12 μm.

Reference Experiment 12

A laminate (R12) of the structure of layers same as that of Reference Experiment 10 was obtained in the same manner as in Reference Experiment 10 but using, as the gas-barrier film, an unstretched polypropylene film of a thickness of 60 μm instead of using the EVOH film of a thickness of 12 μm.

Reference Experiment 13

On the layer of the film B, there were successively dry-laminated a 10 μm-thick urethane adhesive layer (PU) and an INOR-coated PET film X3 in such a manner that the INOR layer was on the inside. The laminate was aged in vacuum at 50° C. for 3 days to obtain a laminate (R13) having a structure of layers described below.

Here, in the structure of layers described below, the adhesive layer (PU) served as the organic layer (ORG).

Outer surface side (high-humidity atmosphere side)→inner surface side (low-humidity atmosphere side) PET/INOR/ORG (PU)/WTR/INOR/PET <Reference Experiment C5>

In Reference Experiment 7, the arrangement of the laminate (R7) was reversed to provide a laminate (RC5) of a structure of layers described below. In this structure of layers, the organic layer (ORG) served as the adhesive layer (PU) and was located (on outer surface side) closer to the side of the high-humidity atmosphere than the water-trapping layer (WTR) was.

Outer surface side (high-humidity atmosphere side)→inner surface side (low-humidity atmosphere side) PET/INOR/ORG (PU)/WTR/PET/INOR <Reference Experiment C6>

A laminate (RC6) of the structure of layers same as that of Reference Experiment 13 was obtained in the same manner as in Reference Experiment 13 but setting the thickness of the urethane adhesive layer (PU) to be 2 μm.

<Evaluation>

The laminates prepared above were measured for their properties by the methods described above. The results were as shown in Table 5.

DESCRIPTION OF REFERENCE NUMERALS

1: plastic base material
3: first inorganic barrier layer
5: water-trapping layer
7: second inorganic barrier layer
9: organic layer
10: auxiliary water-trapping layer
11: water barrier laminate

The invention claimed is:

1. A water barrier laminate comprising a plastic base material, the water barrier laminate being adapted for use in an arrangement wherein an outer surface of the water barrier laminate faces an atmosphere having a relatively high water content and an inner surface of the water barrier laminate faces an atmosphere having a relatively low water content, wherein:
 a first inorganic barrier layer, a water-trapping layer and a second inorganic barrier layer are formed in this order on the inner surface side of said plastic base material;
 an auxiliary water-trapping layer is formed on said inner surface side of said second inorganic barrier layer to trap water from the side surface; and
 said auxiliary water-trapping layer faces the atmosphere having the relatively low water content or is located in a region at a distance of not more than 20 μm from the surface that faces the atmosphere having the relatively low water content.

2. The water barrier laminate according to claim 1, wherein said first inorganic barrier layer and said second inorganic barrier layers are, respectively, vapor-deposited films.

3. The water barrier laminate according to claim 1, wherein said auxiliary water-trapping layer is formed in a thickness of 10 to 300% that of said water-trapping layer.

4. The water barrier laminate according to claim 1, wherein both said water-trapping layer and said auxiliary water-trapping layer have a structure in which a moisture-absorbing agent is dispersed in a moisture-absorbing matrix that comprises an ionic polymer, said moisture-absorbing agent being capable of attaining a humidity lower than that attained by said matrix.

5. The water barrier laminate according to claim 2, wherein an organic layer is provided under said second inorganic barrier layer and is neighboring thereto.

6. The water barrier laminate according to claim 2, wherein an organic layer having a water-diffusing function is formed in a thickness of not less than 10 μm between said first inorganic barrier layer and said water-trapping layer

TABLE 5

| | WTR Thickness μm | Organic layer (ORG) Thickness μm | Organic layer (ORG) Resin | Permeation coefficient g · mm/m² · day | Moisture permeation through the laminate g/m² · day | Long-term stability |
|---|---|---|---|---|---|---|
| REx-7 | 4 | 100 | PET | 0.5 | <0.01 | ⊚ |
| REx-8 | 4 | 12 | PET | 0.5 | <0.01 | ⊚ |
| REx-9 | 4 | 12 | PET | 0.5 | <0.01 | ⊚ |
| REx-10 | 4 | 4/12/4 | PU/EVOH/PU | 2/1.6/2 | <0.01 | ⊚ |
| REx-11 | 4 | 4/15/4 | PU/PA6/PU | 2/2.5/2 | <0.01 | ○ |
| REx-12 | 4 | 4/60/4 | PU/PP/PU | 2/0.25/2 | <0.01 | ⊚ |
| REx-13 | 4 | 10 | PU | 2 | <0.01 | ○ |
| REx-C5 | 4 | 4 | PU | 2 | <0.01 | X |
| REx-C6 | 4 | 2 | PU | 2 | <0.01 | X | and/or between said second inorganic barrier layer and said auxiliary water-trapping layer.

7. The water barrier laminate according to claim 6, wherein said water-diffusing layer contains a polyester resin or an olefin resin, and has a water vapor permeation coefficient of not more than 2.0 g mm/m$^2$·day/atm.

8. The water barrier laminate according to claim 1, wherein a third inorganic barrier layer is formed on said inner surface side of said auxiliary water-trapping layer.

9. The water barrier laminate according to claim 8, wherein an organic layer is provided between said third inorganic barrier layer and said auxiliary water-trapping layer.

10. The water barrier laminate according to claim 8, wherein said third inorganic barrier layer is a cured film of a coating composition that contains a polysilazane and a fluorine-free hydrophobic resin that is not reactive with the polysilazane.

11. The water barrier laminate according to claim 10, wherein said cured film is forming such a gradient of atomic concentrations that a concentration of silicon atoms gradually decreases while a concentration of carbon atoms gradually increases from a surface on the side of the atmosphere of the low water content toward a surface on the side of said auxiliary water-trapping layer as expressed on a basis of the four kinds of atoms of silicon atoms, nitrogen atoms, carbon atoms and oxygen atoms.

* * * * *